(12) United States Patent
Duez et al.

(10) Patent No.: US 12,101,069 B2
(45) Date of Patent: Sep. 24, 2024

(54) LOW VOLTAGE VARIABLE GAIN AMPLIFIER WITH LOW PHASE SENSITIVITY

(71) Applicant: Space Exploration Technologies Corp., Hawthorne, CA (US)

(72) Inventors: Frederic Duez, Crolles (FR); Frederic Paillardet, Crolles (FR)

(73) Assignee: Space Exploration Technologies Corp., Hawthorne, CA (US)

( * ) Notice: Subject to any disclaimer, the term of this patent is extended or adjusted under 35 U.S.C. 154(b) by 360 days.

(21) Appl. No.: 17/707,735

(22) Filed: Mar. 29, 2022

(65) Prior Publication Data
US 2022/0311404 A1  Sep. 29, 2022

Related U.S. Application Data

(60) Provisional application No. 63/167,612, filed on Mar. 29, 2021.

(51) Int. Cl.
*H03G 3/30* (2006.01)
*H03F 3/19* (2006.01)
*H04B 1/04* (2006.01)

(52) U.S. Cl.
CPC ............. *H03G 3/3036* (2013.01); *H03F 3/19* (2013.01); *H04B 1/04* (2013.01); *H03F 2200/451* (2013.01); *H03G 2201/103* (2013.01); *H03G 2201/307* (2013.01)

(58) Field of Classification Search
CPC .......... H03G 3/3036; H03G 2201/103; H03G 2201/307; H03F 3/19; H03F 2200/451; H04B 1/04
See application file for complete search history.

(56) References Cited

U.S. PATENT DOCUMENTS

| | | | |
|---|---|---|---|
| 2006/0164164 A1* | 7/2006 | Rogers | H03F 3/4508 330/252 |
| 2015/0163015 A1* | 6/2015 | Katayama | H04L 25/03057 375/285 |
| 2018/0287577 A1* | 10/2018 | Gorecki | H03F 1/0205 |
| 2019/0207576 A1* | 7/2019 | Forey | H03G 3/225 |
| 2019/0372538 A1* | 12/2019 | Roeckner | H03F 3/45179 |
| 2020/0144978 A1* | 5/2020 | Park | H03F 1/56 |
| 2021/0021246 A1* | 1/2021 | Broekaert | H03G 3/3036 |

* cited by examiner

*Primary Examiner* — Raymond S Dean
(74) *Attorney, Agent, or Firm* — Polsinelli PC

(57) ABSTRACT

Technologies are provided for variable gain amplifiers (VGAs). An example VGA includes a resistor ladder including resistor legs coupled to first and second resistors; first differential switches connected to the resistor ladder and second differential switches connected to output nodes, a transistor in each of the first differential switches being coupled to an first electrical line interconnecting the first resistors and a different transistor in each of the first differential switches being coupled to a second electrical line interconnecting the second resistors; third differential switches connected to the resistor ladder and fourth differential switches connected to the output nodes, a transistor in each of the third differential switches being coupled to the first electrical line and a different transistor in each of the fourth differential switches being coupled to the second electrical line; and a pair of transistors respectively connected to the first differential switches and the third differential switches.

20 Claims, 13 Drawing Sheets

LOW VOLTAGE VARIABLE GAIN AMPLIFIER WITH LOW PHASE SENSITIVITY

CROSS-REFERENCE TO RELATED APPLICATIONS

This application claims priority to U.S. Provisional Application No. 63/167,612, filed on Mar. 29, 2021, entitled "LOW VOLTAGE VARIABLE GAIN AMPLIFIER WITH LOW PHASE SENSITIVITY", the contents of which are incorporated herein in their entirety and for all purposes.

TECHNICAL FIELD

The present disclosure generally relates to electronic circuits and, more specifically, electronic circuits for beamforming.

BACKGROUND

Phased array antennas are used in a variety of wireless communication systems such as satellite and cellular communication systems. The phased array antennas can include a number of antenna elements arranged to behave as a larger directional antenna. Moreover, a phased array antenna can be used to increase an overall directivity and gain, steer the angle of array for greater gain and directivity, perform interference cancellation from one or more directions, determine the direction of arrival of received signals, and improve a signal to interference ratio, among other things. Advantageously, a phased array antenna can be configured to implement beamforming techniques to transmit and/or receive signals in a preferred direction without physically repositioning or reorientation.

Generally, a phased array antenna can apply phase control or time-delay at each antenna element to allow its beam to be shaped and scanned to different directions in space. A phased array antenna can control the phases and amplitudes of radio frequency (RF) signals to the antenna elements to dynamically shape the array factor and radiated pattern. In some examples, the phased array antenna can use phase shifters along the RF path to control the beam. In some cases, the receivers and transmitters in a phased array antenna can use variable gain amplifiers (VGAs) to adapt a signal strength to a desired level and implement phase shifters to control the phase of RF signals. VGAs can provide gain control to enhance a dynamic performance of phased array antennas. However, VGAs can provoke an increase in parasitic capacitance and usually have poor linearity performance. VGAs can also produce significant phase variations relative to gain settings. While compensation circuits can be implemented to limit such phase variations, the compensation circuits can significantly increase current consumption.

BRIEF DESCRIPTION OF THE DRAWINGS

In order to describe the manner in which the various advantages and features of the disclosure can be obtained, a more particular description of the principles described above will be rendered by reference to specific embodiments thereof, which are illustrated in the appended drawings. Understanding that these drawings depict only example embodiments of the disclosure and are not to be considered to limit its scope, the principles herein are described and explained with additional specificity and detail through the use of the drawings in which.

DETAILED DESCRIPTION

Figure 1A:
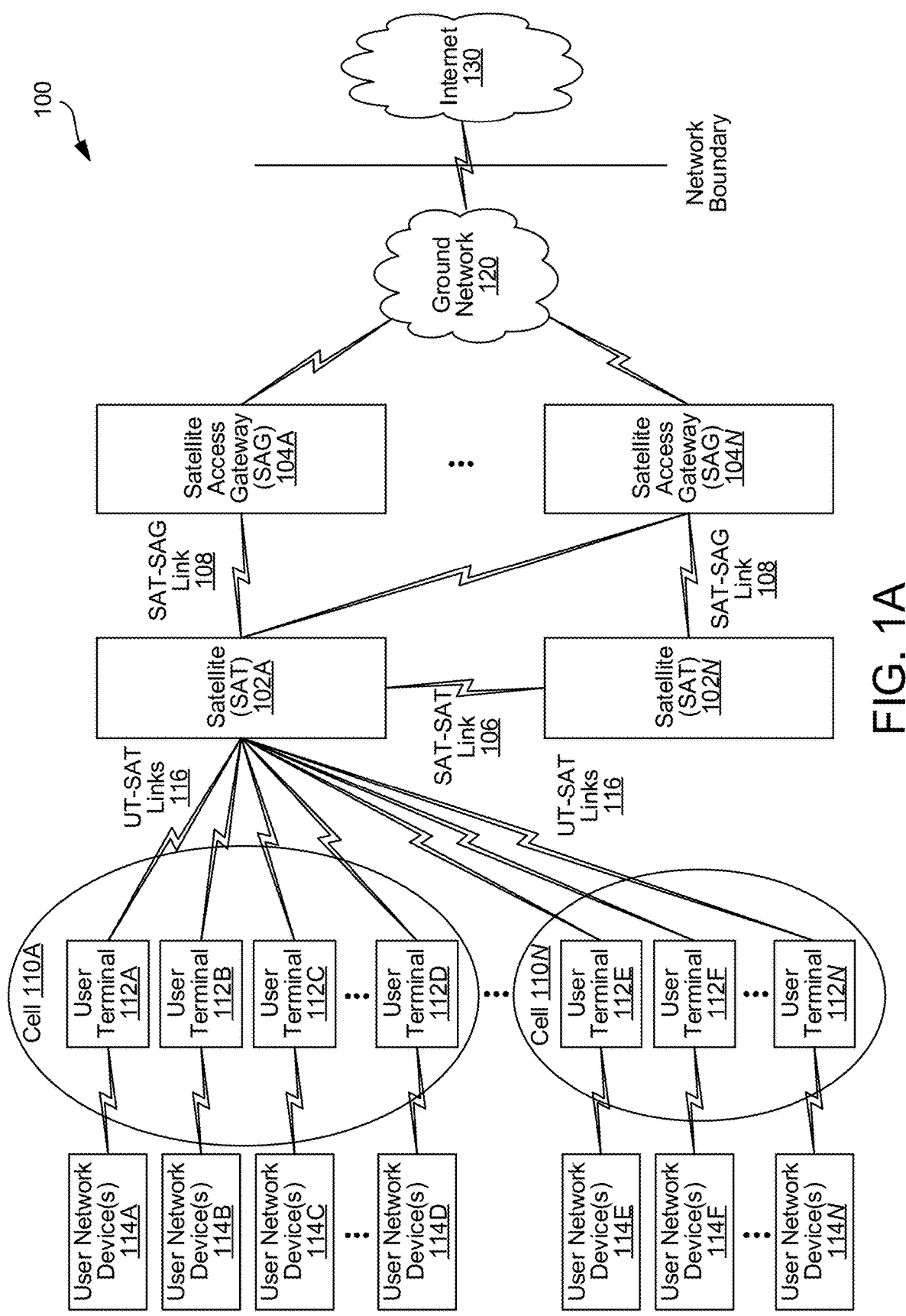
FIG. 1A is a simplified diagram illustrating an example wireless communication system, in accordance with some examples of the present disclosure.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

As previously mentioned, a phased array antenna can apply phase control or time-delay at each antenna element to allow its beam to be shaped and scanned to different directions in space. The phased array antenna can control the phases and amplitudes of radio frequency (RF) signals to the antenna elements to dynamically shape the array factor and radiated pattern. In some examples, the phased array antenna can use phase shifters along the RF path to control the beam. The receivers and transmitters in a phased array antenna can also use variable gain amplifiers (VGAs) to adapt a signal strength to a desired level and implement phase shifters to control the phase of RF signals.

However, VGAs can provoke an increase in parasitic capacitance and usually have poor linearity performance. VGAs can also have significant phase variations relative to gain settings. Moreover, phase shifts along the RF path can be sensitive to gain changes. In many cases, poor linearity performance and phase variations relative to gain settings can cause phase incoherence, and can require continual recalibrations to correct for phase changes in a signal propagated along the RF path. These and other problems can decrease the performance of phased array antennas and can increase the cost and complexity of their circuitry.

In some aspects, systems, apparatuses, processes (also referred to as methods), and computer-readable media (collectively referred to herein as "systems and techniques") are described herein for low voltage VGAs with low phase sensitivity. The VGAs described herein can be implemented in multiple-input, multiple-output (MIMO) and phased array antennas, as well as any other systems for wireless communications such as, for example, satellite communications, 3G/4G/5G/LTE cellular communications, 802.11 Wi-Fi communications, and/or the like. In some examples, the VGAs described herein can be implemented in single or multiple beam phased array systems, and/or antennas operating with or without time-domain duplexing (TDD).

In some cases, the VGAs described herein can be implemented in wireless receiver (Rx) and/or transmitter (Tx) systems to control and adapt a signal strength at a desired level, build phase shifters that enable controlling the phase of RF signals, provide accurate gain steps, provide low phase variations relative to gain settings, provide a constant (or significantly constant) linearity over a gain range, and/or reduce a sensitivity of phase shifts along the RF path to gain changes.

In some examples, the VGAs described herein can include a digitally controlled VGA for phased array antennas. The digitally controlled VGA can provide low voltage capabilities and constant (and/or significantly constant) current. In one illustrative example, the digitally controlled VGA can include a same number of "on" transistors in any gain setting. Moreover, the digitally controlled VGA can include lower parasitic capacitance at output and/or constant (or significantly constant) impedance. The digitally controlled VGA can be power efficient and can maintain low distortion levels even at maximum gain. In some examples, the digitally controlled VGA does not require power back-off to achieve linear performance.

Figure 5:
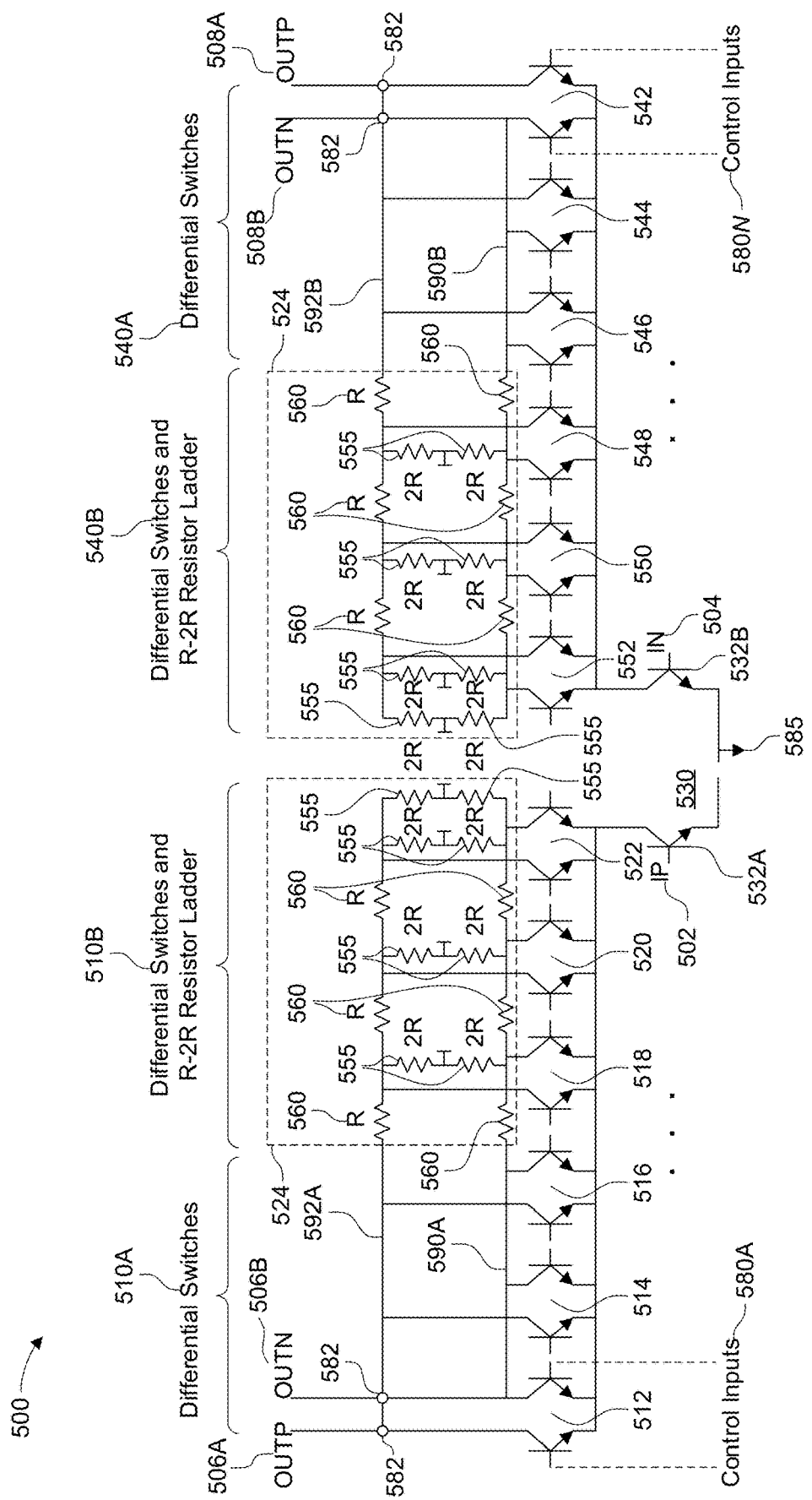
FIG. 5 is a diagram illustrating an example variable gain amplifier circuit that can be implemented to create phase shifters to control the phase of radio frequency signals, in accordance with some examples of the present disclosure.
Figure 6A:
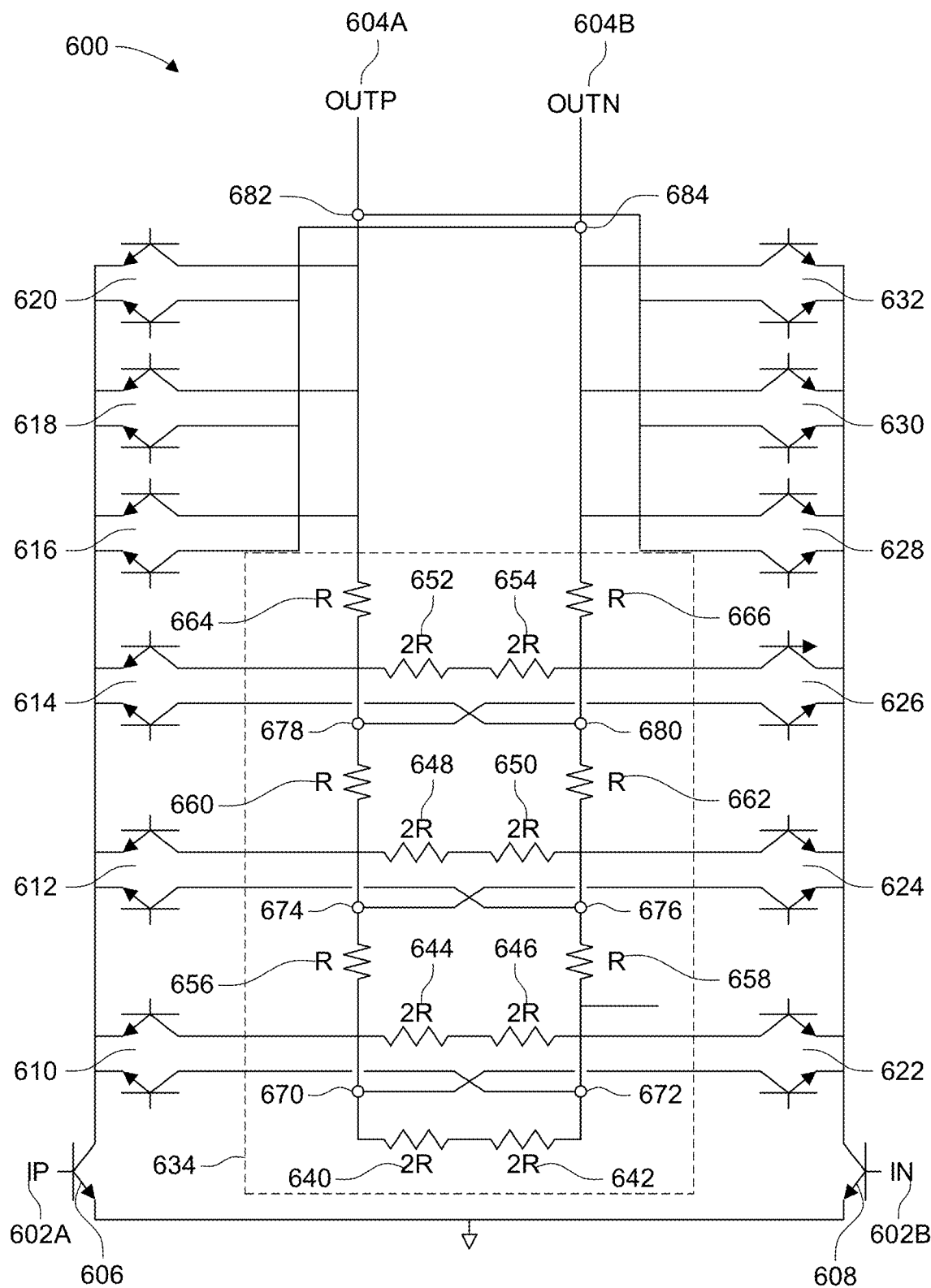
FIGS. 6A and 6B are diagrams illustrating other examples of variable gain amplifier circuits that can be implemented to create phase shifters to control the phase of radio frequency signals, in accordance with some examples of the present disclosure.
Figure 6B:
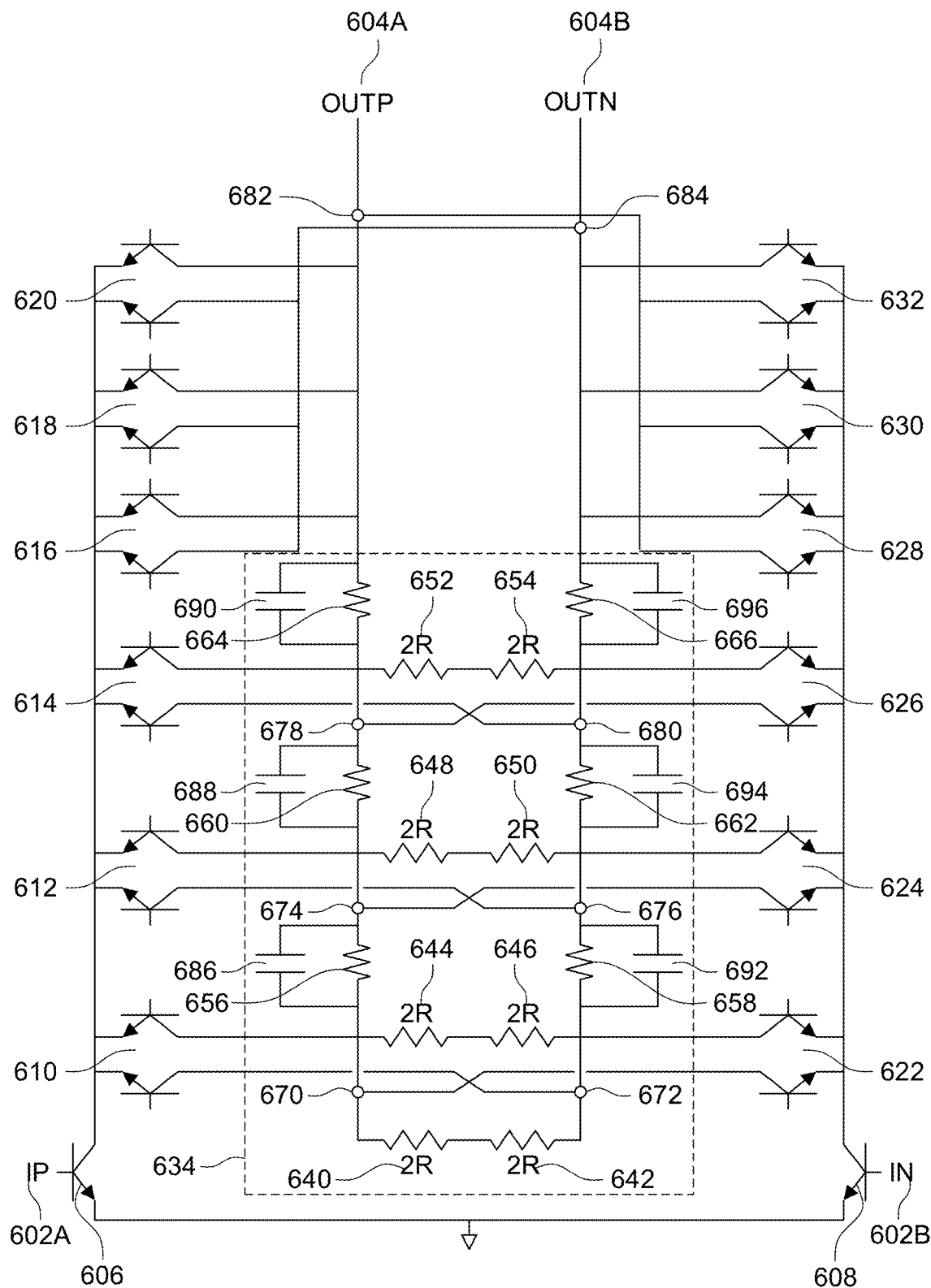
Figure 7:
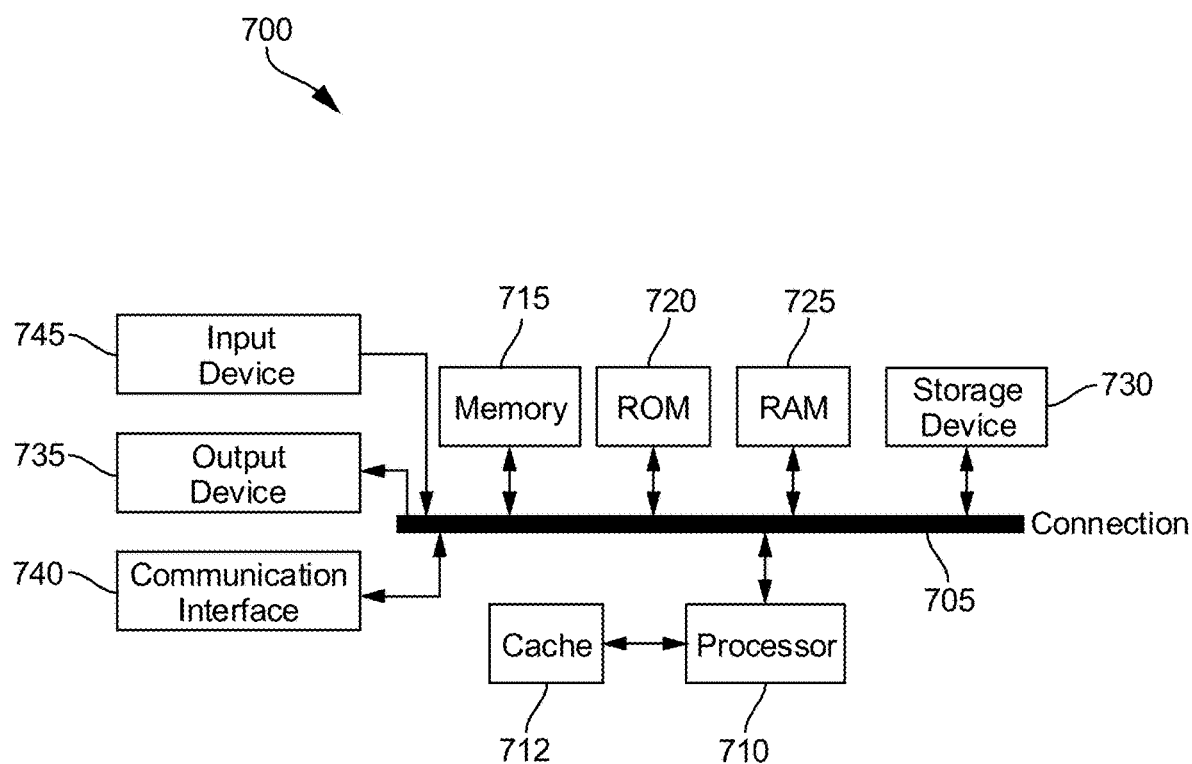
FIG. 7 is a diagram illustrating an example computing device architecture, in accordance with some examples of the present disclosure.

The disclosed systems and techniques will be described in the following disclosure as follows. The discussion begins with a description of example systems and technologies for wireless communications and example phased array antennas, as illustrated in FIGS. 1A through 4C. A description of example VGA circuits that can be implemented in phased array antennas and other electronic systems, as illustrated in FIGS. 5 and 6A-6B, will then follow. The discussion concludes with a description of an example computing device architecture including example hardware components that can be implemented with phased array antennas and other electronic systems, as illustrated in FIG. 7. The disclosure now turns to FIG. 1A.

FIG. 1A is a block diagram illustrating an example wireless communication system 100, in accordance with some examples of the present disclosure. In this example, the wireless communication system 100 is a satellite-based communication system and includes one or more satellites (SATs) 102A-102N (collectively "102"), one or more satellite access gateways (SAGs) 104A-104N (collectively "104"), user terminals (UTs) 112A-112N (collectively "112"), user network devices 114A-114N (collectively "114"), and a ground network 120 in communication with a network 130, such as the Internet.

The SATs 102 can include orbital communications satellites capable of communicating with other wireless devices or networks (e.g., 104, 112, 114, 120, 130) via radio telecommunications signals. The SATs 102 can provide communication channels, such as radio frequency (RF) links (e.g., 106, 108, 116), between the SATs 102 and other wireless devices located at different locations on Earth and/or in orbit. In some examples, the SATs 102 can establish communication channels for Internet, radio, television, telephone, radio, military, and/or other applications.

The user terminals 112 can include any electronic devices and/or physical equipment that support RF communications to and from the SATs 102. The SAGs 104 can include gateways or earth stations that support RF communications to and from the SATs 102. The user terminals 112 and the SAGs 104 can include antennas for wirelessly communicating with the SATs 102. The user terminals 112 and the SAGs 104 can also include satellite modems for modulating and demodulating radio waves used to communicate with the SATs 102. In some examples, the user terminals 112 and/or the SAGs 104 can include one or more server computers, routers, ground receivers, earth stations, user equipment, antenna systems, communication nodes, base stations, access points, and/or any other suitable device or equipment. In some cases, the user terminals 112 and/or the SAGS 104 can perform phased-array beamforming and digital processing to support highly directive, steered antenna beams that track the SATs 102. Moreover, the user terminals 112 and/or the SAGs 104 can use one or more frequency bands to communicate with the SATs 102, such as the Ku and/or Ka frequency bands.

The user terminals 112 can be used to connect the user network devices 114 to the SATs 102 and ultimately the Internet 130. The SAGs 104 can be used to connect the ground network 120 and the Internet 130 to the SATs 102. For example, the SAGs 104 can relay communications from the ground network 120 and/or the Internet 130 to the SATs 102, and communications from the SATs 102 (e.g., communications originating from the user network devices 114, the user terminals 112, or the SATs 102) to the ground network 120 and/or the Internet 130.

The user network devices 114 can include any electronic devices with networking capabilities and/or any combination of electronic devices such as a computer network. For example, the user network devices 114 can include routers, network modems, switches, access points, smart phones, laptop computers, servers, tablet computers, set-top boxes, Internet-of-Things (IoT) devices, smart wearable devices (e.g., head-mounted displays (HMDs), smart watches, etc.), gaming consoles, smart televisions, media streaming devices, autonomous vehicles or devices, user networks, etc. The ground network 120 can include one or more networks and/or data centers. For example, the ground network 120 can include a public cloud, a private cloud, a hybrid cloud, an enterprise network, a service provider network, an on-premises network, and/or any other network.

In some cases, the SATs 102 can establish communication links between the SATs 102 and the user terminals 112. For example, SAT 102A can establish communication links 116 between the SAT 102A and the user terminals 112A-112D and/or 112E-112N. The communication links 116 can provide communication channels between the SAT 102A and the user terminals 112A-112D and/or 112E-112N. In some examples, the user terminals 112 can be interconnected (e.g., via wired and/or wireless connections) with the user network devices 114. Thus, the communication links between the SATs 102 and the user terminals 112 can enable communications between the user network devices 114 and the SATs 102. In some examples, each of the SATs 102A-102N can serve user terminals 112 distributed across and/or located within one or more cells 110A-110N (collectively "110"). The cells 110 can represent geographic areas served and/or covered by the SATs 102. For example, each cell can represent an area corresponding to the satellite footprint of radio beams propagated by a SAT. In some cases, a SAT can cover a single cell. In other cases, a SAT can cover multiple cells. In some examples, a plurality of SATs 102 can be in operation simultaneously at any point in time (also referred to as a satellite constellation). Moreover, different SATs can serve different cells and sets of user terminals.

The SATs 102 can also establish communication links 106 with each other to support inter-satellite communications. Moreover, the SATs 102 can establish communication links 108 with the SAGs 104. In some cases, the communication links between the SATs 102 and the user terminals 112 and the communication links between the SATs 102 and the SAGs 104 can allow the SAGs 104 and the user terminals 112 to establish a communication channel between the user network devices 114, the ground network 120 and ultimately the Internet 130. For example, the user terminals 112A-112D and/or 112E-112N can connect the user network devices 114A-114D and/or 114E-114N to the SAT 102A through the communication links 116 between the SAT 102A and the user terminals 112A-112D and/or 112E-112N. The SAG 104A can connect the SAT 102A to the ground network 120, which can connect the SAGs 104A-104N to the Internet 130. Thus, the communication links 108 and 116, the SAT 102A, the SAG 104A, the user terminals 112A-112D and/or 112E-112N and the ground network 120 can allow the user network devices 114A-114D and/or 114E-114N to connect to the Internet 130.

In some examples, a user can initiate an Internet connection and/or communication through a user network device from the user network devices 114. The user network device can have a network connection to a user terminal from the user terminals 112, which it can use to establish an uplink (UL) pathway to the Internet 130. The user terminal can wirelessly communicate with a particular SAT from the SATs 102, and the particular SAT can wirelessly communicate with a particular SAG from the SAGs 104. The particular SAG can be in communication (e.g., wired and/or wireless) with the ground network 120 and, by extension, the Internet 130. Thus, the particular SAG can enable the Internet connection and/or communication from the user network device to the ground network 120 and, by extension, the Internet 130.

In some cases, the particular SAT and SAG can be selected based on signal strength, line-of-sight, and the like. If a SAG is not immediately available to receive communications from the particular SAT, the particular SAG can be configured to communicate with another SAT. The second SAT can in turn continue the communication pathway to a particular SAG. Once data from the Internet 130 is obtained for the user network device, the communication pathway can be reversed using the same or different SAT and/or SAG as used in the UL pathway.

In some examples, the communication links (e.g., 106, 108, and 116) in the wireless communication system 100 can operate using orthogonal frequency division multiple access (OFDMA) via time domain and frequency domain multiplexing. OFDMA, also known as multicarrier modulation, transmits data over a bank of orthogonal subcarriers harmonically related by the fundamental carrier frequency. Moreover, in some cases, for computational efficiency, fast Fourier transforms (FFT) and inverse FFT can be used for modulation and demodulation.

While the wireless communication system 100 is shown to include certain elements and components, one of ordinary skill will appreciate that the wireless communication system 100 can include more or fewer elements and components than those shown in FIG. 1A. For example, the wireless communication system 100 can include, in some instances, networks, cellular towers, communication hops or pathways, network equipment, and/or other electronic devices that are not shown in FIG. 1A.

Figure 1B:
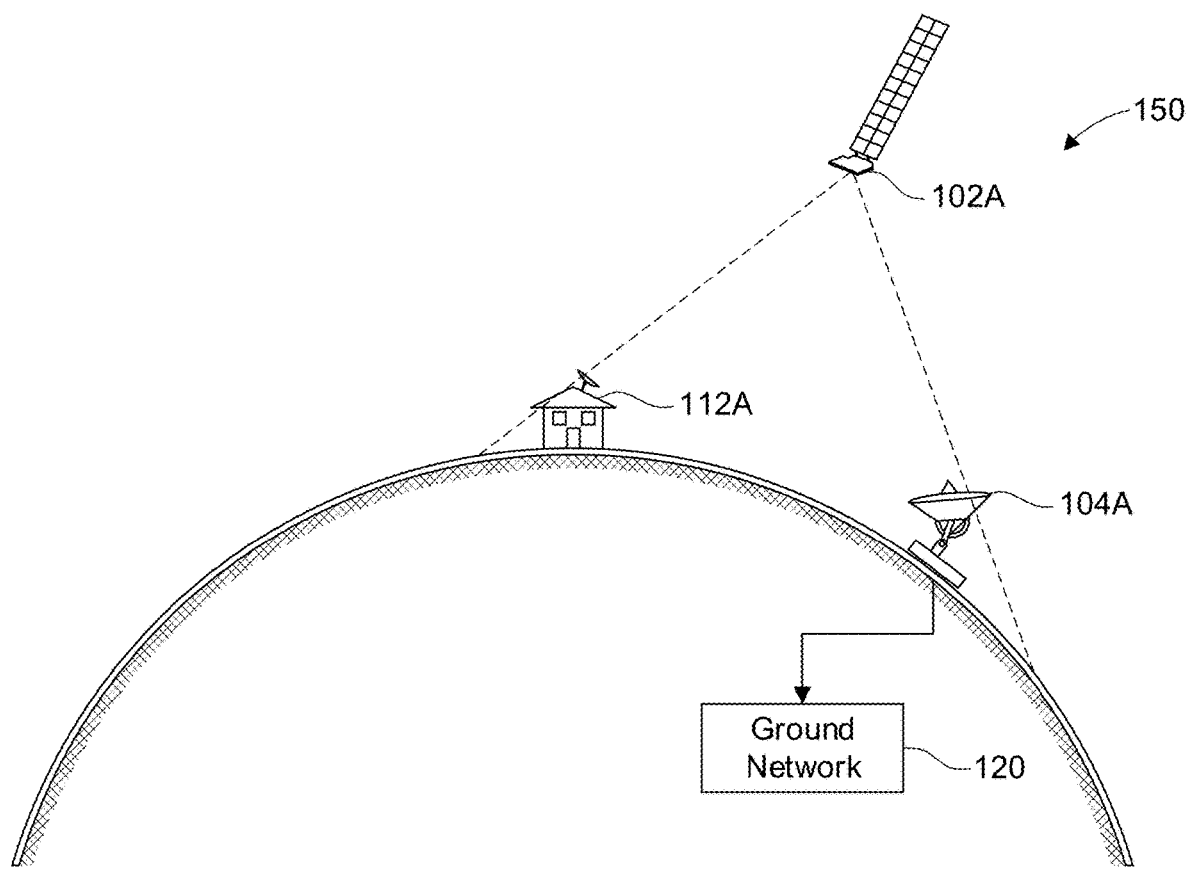
FIG. 1B is a simplified diagram illustrating an example of communication in a satellite communication system, in accordance with some examples of the present disclosure.

FIG. 1B is a diagram illustrating an example of an antenna and satellite communication system 150 in accordance with some examples of the present disclosure. As shown in FIG. 1B, an Earth-based UT 112A is installed at a location directly or indirectly on the Earth's surface such as a house, building, tower, vehicle, or another location where it is desired to obtain communication access via a network of satellites.

A communication path may be established between the UT 112A and SAT 102A. In the illustrated example, the SAT 102A, in turn, establishes a communication path with a SAG 104A. In another example, the SAT 102A may establish a communication path with another satellite prior to communication with SAG 104A. The SAG 104A may be physically connected via fiber optic, Ethernet, or another physical connection to a ground network 120. The ground network 120 may be any type of network, including the Internet. While one satellite is illustrated, communication may be with and between a constellation of satellites.

Figure 2A:
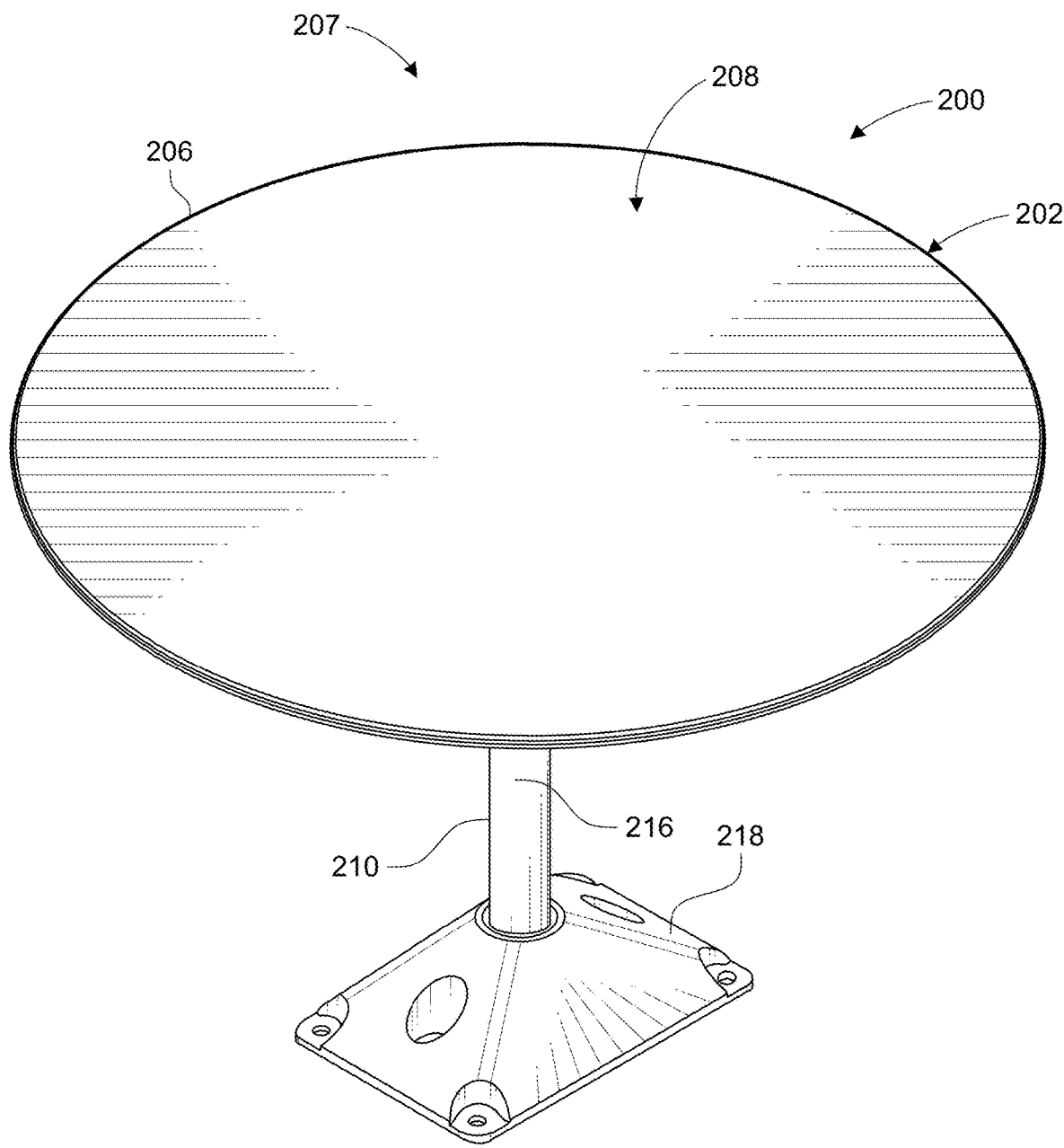
FIGS. 2A and 2B are isometric top and bottom views depicting an exemplary antenna apparatus, in accordance with some examples of the present disclosure.
Figure 2B:
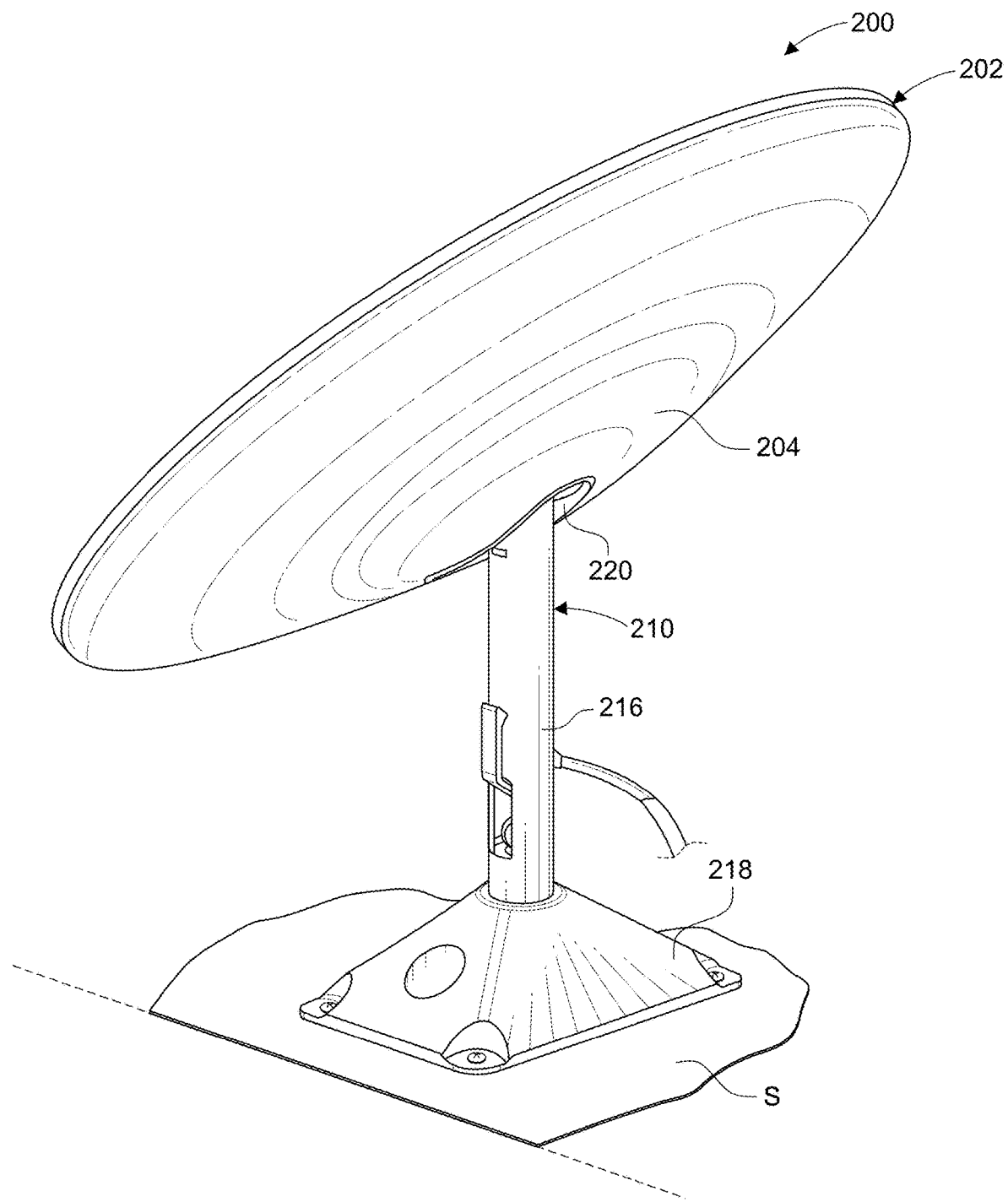

In some examples, the UT 112A may include an antenna system disposed in an antenna apparatus 200, for example, as illustrated in FIGS. 2A and 2B, designed for sending and/or receiving radio frequency signals to and/or from a satellite or a constellation of satellites. FIG. 2A illustrates an example top view of the antenna apparatus 200. The antenna apparatus 200 may include an antenna aperture 207 defining an area for transmitting and receiving signals, such as a phased array antenna system or another antenna system. The antenna apparatus 200 may include a top enclosure 208 that couples to a radome assembly 206 to define a housing 202. The antenna apparatus 200 can also include a mounting system 210 having a leg 216 and a base 218.

FIG. 2B illustrates a perspective view of an underside of the antenna apparatus 200. As shown, the antenna apparatus 200 may include a lower enclosure 204 that couples to the radome portion 206 to define the housing 202. In the illustrated example, the mounting system 210 includes a leg 216 and a base 218. The base 218 may be securable to a surface S and configured to receive a bottom portion of the leg 216. A tilting mechanism 220 (details not shown) disposed within the lower enclosure 204 permits a degree of tilting to point the face of the radome portion 206 at a variety of angles for optimized communication and for rain and snow run-off.

Figure 3A:
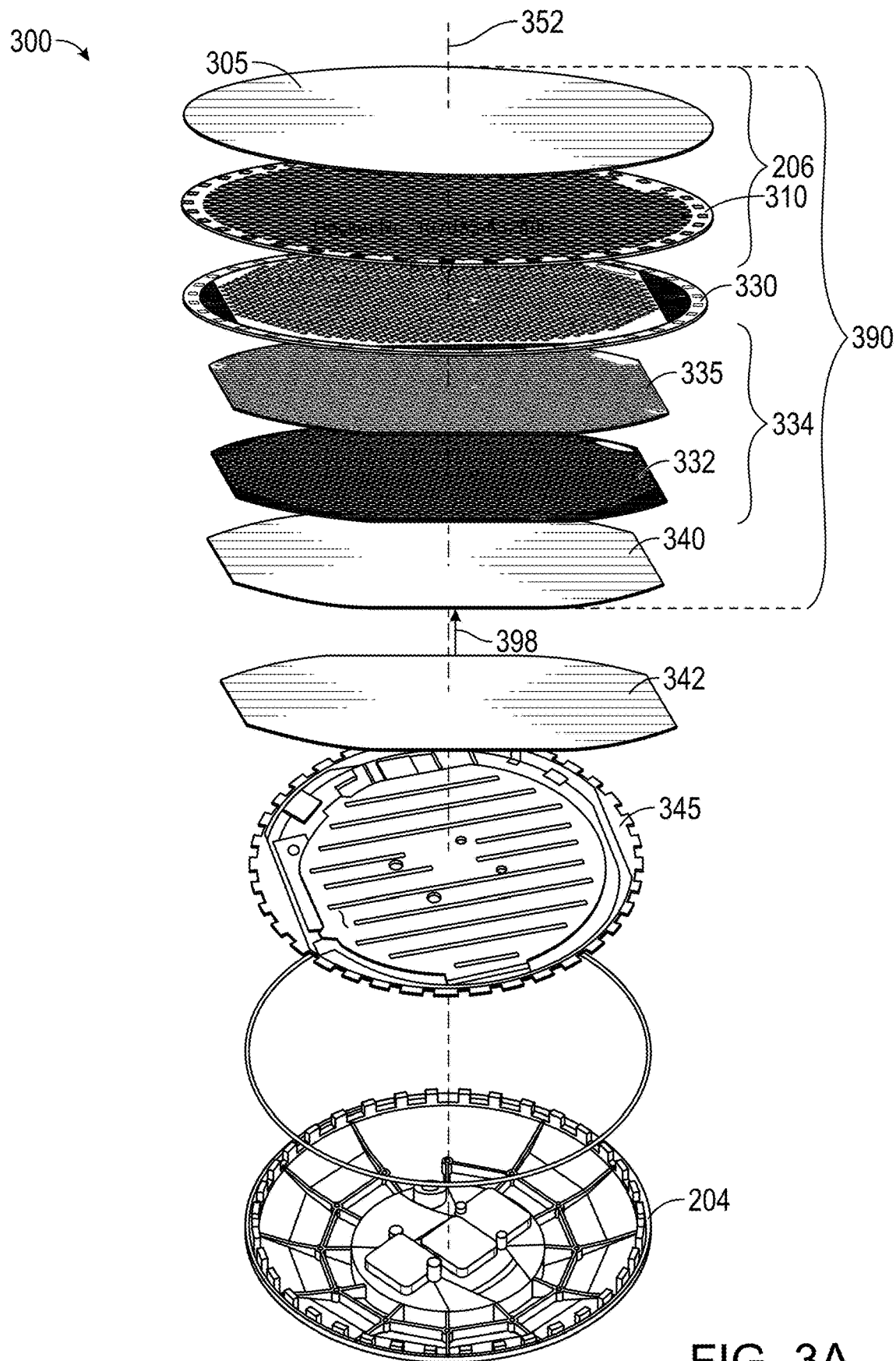
FIG. 3A is an isometric exploded view depicting an exemplary antenna apparatus including the housing and the antenna stack assembly, in accordance with some examples of the present disclosure.

Referring to FIG. 3A, an antenna stack assembly 300 can include a plurality of antenna components, which can include a printed circuit board (PCB) assembly 342 configured to couple to other electrical components disposed within the housing 202 (including lower enclosure 204 and radome assembly 206). In the illustrated example, the antenna stack assembly 300 includes a phased array antenna assembly including a plurality of individual antenna elements configured in an array. The components of the phased array antenna assembly 334 may be mechanically and electrically supported by the PCB assembly 342.

Figure 3B:
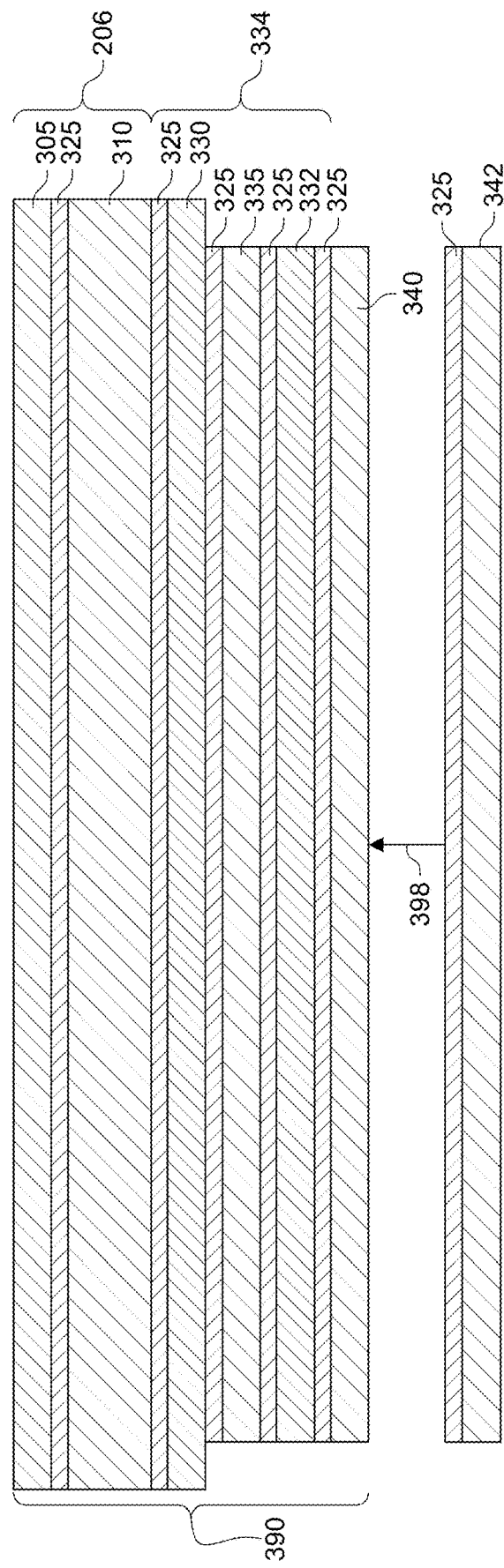
FIG. 3B is a cross-sectional view of an antenna stack assembly of an antenna apparatus, in accordance with some examples of the present disclosure.

In the illustrated example of FIGS. 3A and 3B, the layers in the antenna stack assembly 300 layup include a radome assembly 206 (including radome 305 and radome spacer 310), a phased array antenna assembly 334 (including upper patch layer 330, lower patch layer 332, and antenna spacer 335 in between), a dielectric layer 340, and PCB assembly 342, as will be described in greater detail below. As seen in FIG. 3B, the layers may include adhesive coupling 325 between adjacent layers.

Figure 4A:
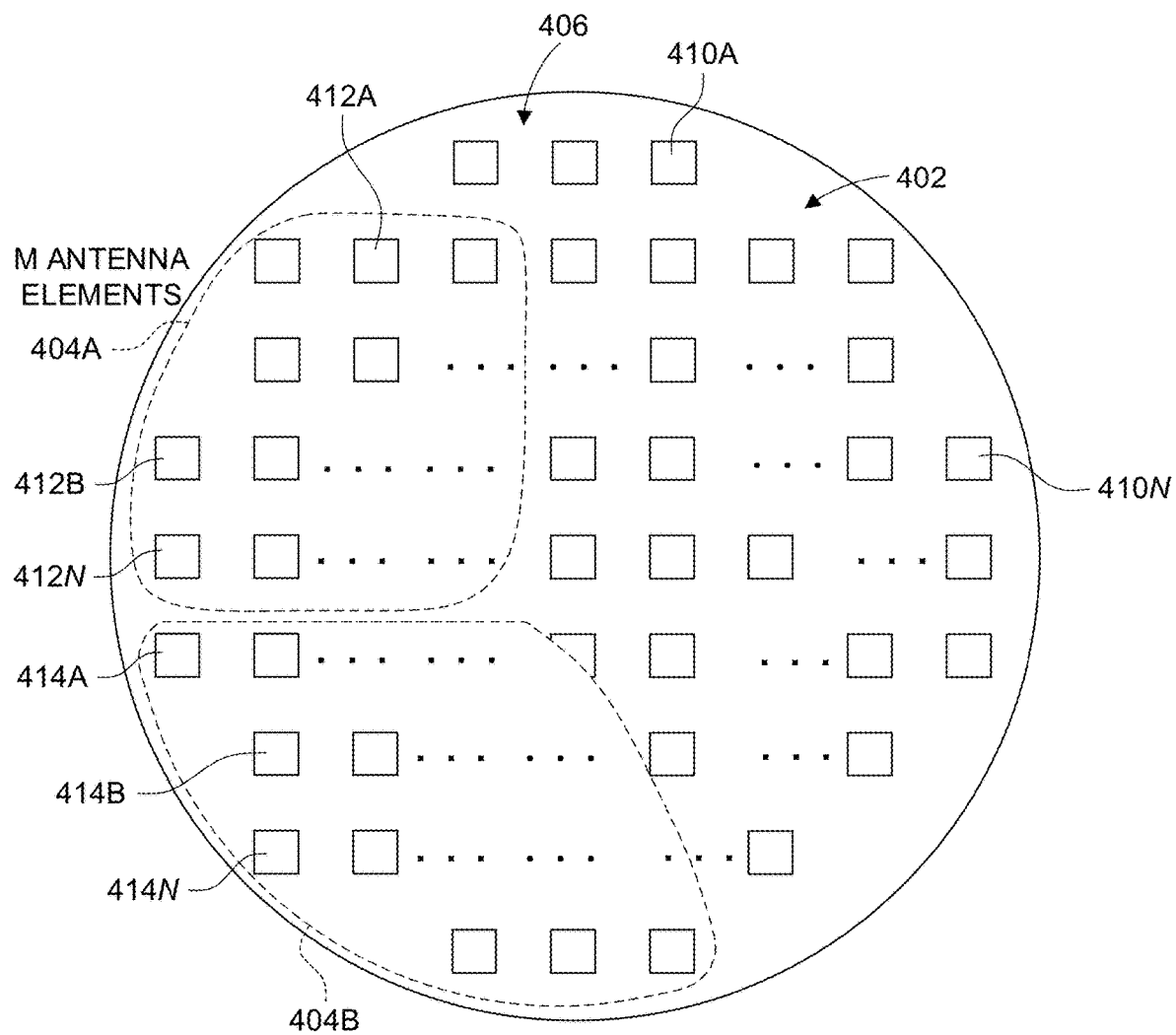
FIG. 4A is a diagram illustrating an example illustration of a top view of an antenna lattice, in accordance with some examples of the present disclosure.

FIG. 4A is a diagram illustrating an example top view of an antenna lattice 406, in accordance with some examples of the present disclosure. The antenna lattice 406 can be part of a phased array antenna system, as further described below with respect to FIGS. 4B and 4C. The antenna lattice 406 can include antenna elements 410A-410N (collectively "410"), 412A-412N (collectively "412"), 414A-414N (collectively "414") configured to transmit and/or send radio frequency signals. In some examples, the antenna elements 410, 412, 414 can be coupled to (directly or indirectly) corresponding amplifiers, as further described below with respect to FIGS. 4B and 4C. The amplifiers can include, for example, low noise amplifiers (LNAs) in the receiving (Rx) direction or power amplifiers (PAs) in the transmitting (Tx) direction.

An antenna aperture 402 of the antenna lattice 406 can be an area through which power is radiated or received. A phased array antenna can synthesize a specified electric field (phase and amplitude) across the aperture 402. The antenna lattice 406 can define the antenna aperture 402 and can include the antenna elements 410, 412, 414 arranged in a particular configuration that is supported physically and/or electronically by a PCB.

Figure 4B:
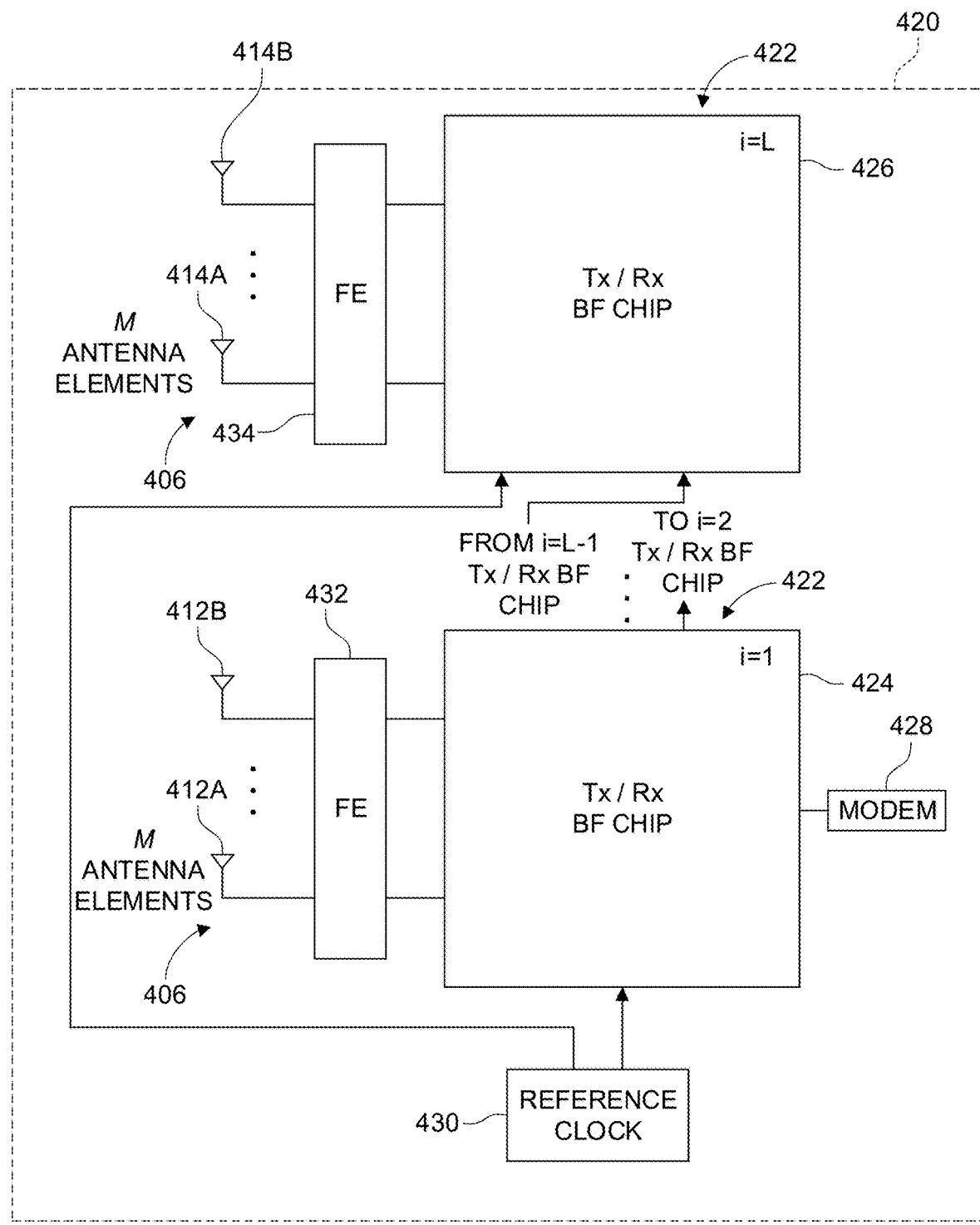
FIG. 4B is a diagram illustrating an example phased array antenna system, in accordance with some examples of the present disclosure.
Figure 4C:
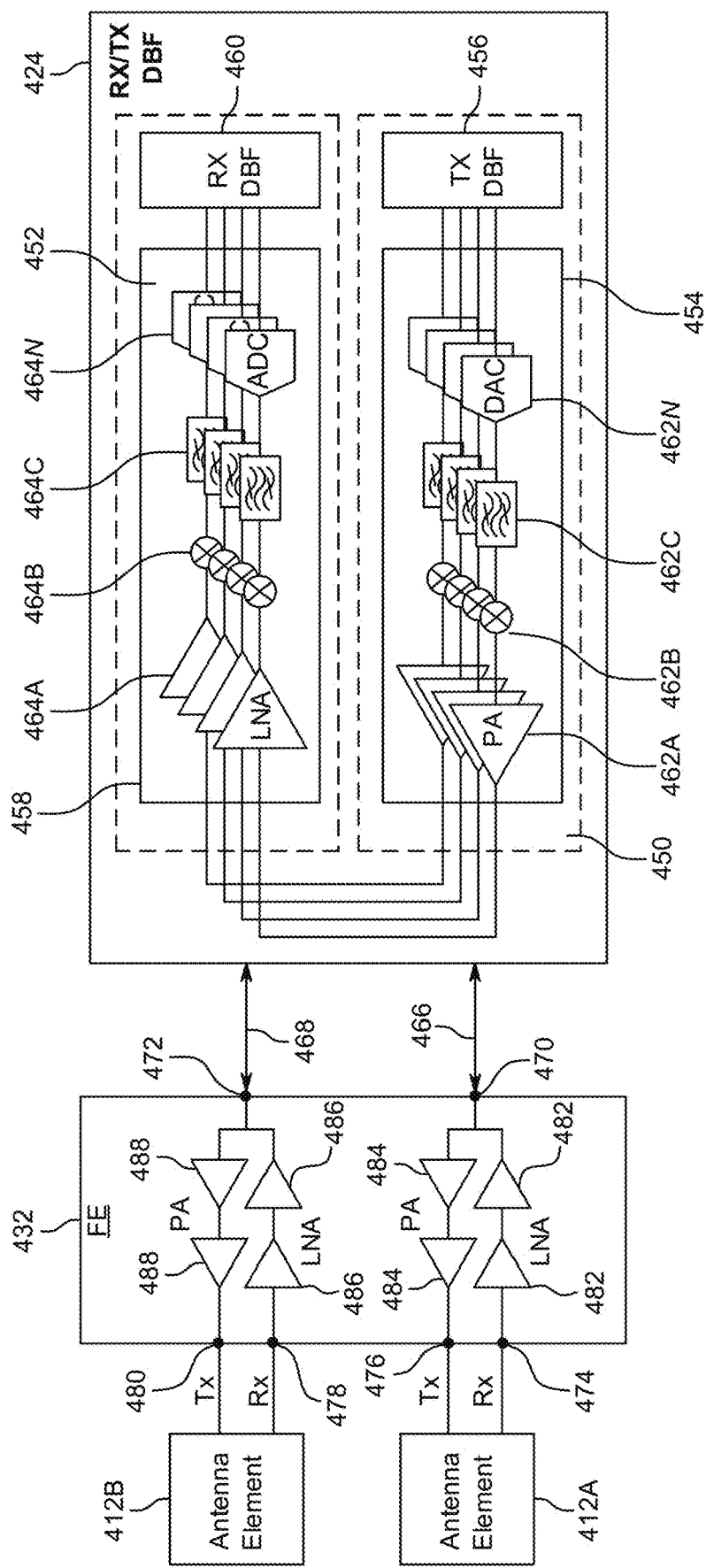
FIG. 4C is a diagram illustrating example components of a beamformer chip and a frontend that interfaces the beamformer chip with antenna elements, in accordance with some examples of the present disclosure.

In some cases, the antenna aperture 402 can be grouped into subsets of antenna elements 404A and 404B. Each subset of antenna elements 404A and 404B can include M number of antenna elements 412, 414, which can be associated with specific beamformer (BF) chips as shown in FIGS. 4B and 4C. The remaining antenna elements 410 in the antenna aperture 402 can be similarly associated with other beamformer chips (not shown).

FIG. 4B is a diagram illustrating an example phased array antenna system 420, in accordance with some examples. The phased array antenna system 420 can include an antenna lattice 406 including antenna elements 412, 414, and a beamformer lattice 422, which in this example includes beamformer (BF) chips 424, 426, for receiving signals from a modem 428 in the transmit (Tx) direction and sending signals to the modem 428 in the receive (Rx) direction. The antenna lattice 406 can be configured to transmit or receive a beam of radio frequency signals having a radiation pattern from or to the antenna aperture 402.

The BF chips 424, 426 in the beamformer lattice 422 can include an L number of BF chips. For example, BF chip 424 can include a BF chip i (i=1, where i=1 to L), and so forth, and BF chip 426 can include the $L_{th}$ BF chip (i=L) of the BF chips in the beamformer lattice 422. Each BF chip of the beamformer lattice 422 electrically couples with a group of respective M number of antenna elements. In the illustrated example, BF chip 424 electrically couples with M antenna elements 412 and BF chip 426 electrically couples with M antenna elements 414. In the illustrated example, the BF chips in the beamformer lattice 422 are electrically coupled to each other in a daisy chain arrangement. However, other types of beamformers (e.g., analog, hybrid, etc.), beamforming techniques, configurations, coupling arrangements, etc., are within the scope of the present disclosure. For example, in other implementations, aspects of the disclosure can be implemented using analog beamforming or hybrid beamforming (e.g., implementing combined aspects of analog and digital beamforming). As another example, in other implementations, aspects of the disclosure can be implemented using beamformers having a different arrangement(s) and/or electrical coupling structure(s) such as, for example and without limitation, a multiplex feed network or a hierarchical network or H-network.

Each BF chip of the beamformer lattice 422 can include an integrated circuit (IC) chip or an IC chip package including a plurality of pins. In some cases, a first subset of the plurality of pins can be configured to communicate signals with a respective, electrically coupled BF chip(s) (if in a daisy chain configuration), and/or modem 428 in the case of BF chip 424. A second subset of the plurality of pins can be configured to transmit/receive signals with M antenna elements, and a third subset of the plurality of pins can be configured to receive a signal from a reference clock 430. The BF chips in the beamformer lattice 422 may also be referred to as transmit/receive (Tx/Rx) BF chips, Tx/Rx chips, transceivers, BF transceivers, and/or the like. As described above, the BF chips may be configured for Rx communication, Tx communication, or both.

In some cases, the BF chips 424, 426 in the beamformer lattice 422 can include amplifiers, phase shifters, mixers, filters, up samplers, down samplers, VGAs, and/or other electrical components. In the receiving direction (Rx), a beamformer function can include delaying signals arriving from each antenna element so the signals arrive to a combining network at the same time. In the transmitting direction (Tx), the beamformer function can include delaying the signal sent to each antenna element such that the signals arrive at the target location at the same time (or substantially the same time). This delay can be accomplished by using "true time delay" or a phase shift at a specific frequency. In some examples, each of the BF chips 424, 426 can be configured to operate in half duplex mode, where the BF chips 424, 426 switch between receive and transmit modes as opposed to full duplex mode where RF signals/waveforms can be received and transmitted simultaneously. In other examples, each of the BF chips 424, 426 can be configured to operate in full duplex mode, where RF signals/waveforms can be received and transmitted simultaneously.

The phased array antenna system 420 can include frontend (FE) components 432, 434 that interface with the BF chips 424, 426 and the antenna elements 412, 414. For example, the FE 432 can communicatively couple the BF chip 424 with M antenna elements 412, and the FE 434 can communicatively couple the BF chip 426 with M antenna elements 414. The FEs 432, 434 can include RF or millimeter wave (mmWave) frontend integrated circuits, modules, devices, and/or any other type of frontend package and/or component(s). In some cases, the FEs 432, 434 can include multiple-input, multiple-output FEs interfacing with multiple antenna elements and one or more BF chips.

The FEs 432, 434 can include various components, such as RF ports, BF ports, amplifiers (e.g., PAs, LNAs, VGAs, etc.), and the like. In some examples, in Rx mode, the FEs 432, 434 can provide a gain to RF contents of each Rx input, and low noise power to suppress the signal-to-noise ratio impacts of noise contributors downstream in the Rx chain/path. Moreover, in Tx mode, the FEs 432, 434 can provide gain to each Tx path and drive RF power into a corresponding antenna element.

FIG. 4C is a diagram illustrating example components of a BF chip 424 and a FE 432 that interfaces the BF chip 424 with antenna elements 412A, 412B. In this example, the BF chip 424 can include a transmit section 450 and a receive section 452, and the FE 432 can include RF ports 470, 472 for RF inputs/outputs to and from the BF chip 424, Rx port 474 for receive signals and Tx port 476 for transmit signals to and from antenna element 412A, and Rx port 478 for receive signals and Tx port 480 for transmit signals to and from antenna element 412B.

The transmit section 450 can include a transmit beamformer (Tx BF) 456 and one or more RF sections 454. The Tx BF 456 can include a number of components (e.g., digital and/or analog) such as, for example and without limitation, a VGA, a time delay filter, a filter, a gain control, one or more phase shifters, one or more up samplers, one or more IQ gain and phase compensators, and the like. Each RF section 454 can also include a number of components (e.g., digital and/or analog). In this example, each RF section 454 includes a power amplifier (PA) 462A, a mixer 462B, a filter 462C such as a low pass filter, and a digital-to-analog converter (DAC) 462N. The one or more RF sections 454 can be configured to ready the time delay and phase encoded digital signals for transmission. In some examples, the one or more RF sections 454 can include an RF section 454 for each signal path 466, 468 to each antenna element 412A, 412B.

The receive section 452 can include a receive beamformer (Rx BF) 460 and one or more RF sections 458. The Rx BF 460 can include a number of components such as, for example and without limitation, a VGA, a time delay filter, a filter, an adder, one or more phase shifters, one or more down samplers, one or more filters, one or more IQ compensators, one or more direct current offset compensators (DCOCs), and the like. Each RF section 458 can also include a number of components. In this example, each RF section 458 includes a low noise amplifier (LNA) 464A, a mixer 464B, a filter 464C such as a low pass filter, and an analog-to-digital converter (ADC) 464N. In some examples, the one or more RF sections 458 can include an RF section 458 for each signal path 466, 468 to each antenna element 412A, 412B.

The FE 432 can include one or more components 482 for processing Rx signals from the antenna element 412A and one or more components 484 for processing Tx signals to the antenna element 412A. The FE 432 can also include one or more components 486 for processing Rx signals from the antenna element 412B and one or more components 488 for processing Tx signals to the antenna element 412B. In FIG. 4C, the components 482 and 486 include LNAs to amplify respective signals from the antenna elements 412A, 412B without significantly degrading the signal-to-noise ratio of the signals, and the components 484 and 488 include PAs to amplify signals from the transmit section 456 to the antenna elements 412A, 412B. In some examples, the FE 432 can include other components such as, for example, VGAs and/or phase shifters (e.g., for Rx and/or Tx).

In some cases, the FE 432 can be communicatively coupled to one or more 90-degree hybrid couplers (not shown), which can be communicatively coupled to the antenna elements 412A, 412B. In some examples, a 90-degree hybrid coupler can be used for power splitting in the Rx direction and power combining in the Tx direction and/or to interface the FE 432 with a circularly polarized antenna element. However, other directional coupler mechanisms are within the scope of the present disclosure.

The BF chip 424 and FE 432 can process data signals, streams, or beams for transmission by the antenna elements 412A, 412B, and receive data signals, streams, or beams from antenna elements 412A, 412B. The BF chip 424 can also recover/reconstitute the original data signal in a signal received from antenna elements 412A, 412B and FE 432. Moreover, the BF chip 424 can strengthen signals in desired directions and suppress signals and noise in undesired directions.

For example, in transmit mode (e.g., the transmit direction), the one or more RF sections 454 of the transmit section 450 can process signals from the Tx BF 456 and output corresponding signals amplified by the PA 462A. Signals to the antenna element 412A can be routed through signal path 466 to RF port 470 of the FE 432, and signals to the antenna element 412B can be routed through signal path 468 to RF port 472 of the FE 432. The FE 432 can process an RF signal received from signal path 466 and output an amplified RF signal through Tx port 476. Antenna element 412A can receive the amplified RF signal and radiate the amplified RF signal. Similarly, the FE 432 can process an RF signal received from signal path 468 and output an amplified RF signal through Tx port 480. Antenna element 412B can receive the amplified RF signal and radiate the amplified RF signal.

In receive mode (e.g., the receive direction), FE 432 can receive RF signals from antenna elements 412A, 412B and process the RF signals using components 482 and 486. The FE 432 can receive RF signals from antenna element 412A via RF port 474, and RF signals from antenna element 412B through RF port 478. The components 482 and 486 can amplify respective RF signals from the antenna elements 412A, 412B without significantly degrading the signal-to-noise ratio of the RF signals. The components 482 can output RF signals from the antenna element 412A, which can be routed from RF port 470 of the FE 432 through the signal path 466 to the receive section 452 of the BF chip 424. Similarly, the components 486 can output RF signals from the antenna element 412B, which can be routed from RF port 472 of the FE 432 through the signal path 468 to the receive section 452 of the BF chip 424.

The one or more RF sections 458 of the receive section 452 of the BF chip 424 can process the received RF signals and output the processed signal to the Rx BF 460. In some example, the processed signal can include a signal amplified by an LNA 464A of RF section 458. The Rx BF 460 can receive the signal and output a beamformed signal to a modem (e.g., modem 428).

In some examples, the transmit section 450 and the receive section 452 can support a same number and/or set of antenna elements. In other examples, the transmit section 450 and the receive section 452 can support different numbers and/or sets of antenna elements. Moreover, while FIG. 4C illustrates a single FE interfacing with the BF chip 424, it should be noted that a BF chip can interface with multiple FEs. The configuration of a single FE interfacing with a BF chip in FIG. 4C is merely an illustrative example provided for explanation purposes. Also, while the FE 432 is shown in FIG. 4C with 2 RF inputs (e.g., RF ports 474 and 478) and 2 RF outputs (e.g., RF ports 476 and 480) supporting 2 antenna elements (e.g., antenna elements 412A and 412B), it should be noted that, in other examples, the FE 432 can include more or less RF inputs/outputs and can support more or less antenna elements than shown in FIG. 4C. For example, in some cases, the FE 432 can include 4 RF inputs and 4 RF outputs and can support more than 2 antenna elements.

While the BF chip 424 and the FE 432 are shown to include certain elements and components, one of ordinary skill will appreciate that the BF chip 424 and the FE 432 can include more or fewer elements and components than those shown in FIG. 4C. For example, in some cases, the BF chip 424 and/or the FE 432 can be coupled to, reside on, and/or implemented by, a printed circuit board (PCB) of the phased array antenna system and/or any number of discrete parts on a PCB. The elements and components of the BF chip 424 and the FE 432 shown in FIG. 4C are merely illustrative examples provided for explanation purposes. Moreover, the example phased array antenna system 420 in FIG. 4B is merely an example implementation provided for explanation purposes. One of skill in the art will recognize that, in other implementations, the phased array antenna system 420 can include more or less of the same and/or different components than those shown in FIG. 4B. For example, in other implementations, the phased array antenna system 420 can implement other beamformers (e.g., analog, digital, hybrid), a different number and/or arrangement of beamformers and/or FEs, and/or any other type and/or configuration of beamformers and/or FEs.

FIG. 5 is a diagram illustrating an example variable gain amplifier (VGA) circuit 500 that can be implemented to create phase shifters to control the phase of RF signals. The VGA circuit 500 can be, for example, a digitally controlled binary weighted VGA. In some cases, the VGA circuit 500 can be implemented by and/or part of a phased array antenna system (e.g., phased array antenna system 420). For example, the VGA circuit 500 can be implemented by and/or part of one or more components and/or circuits of a phased array antenna system such as an FE (e.g., FE 432, FE 434), a BF (e.g., BF 424, BF 426), a receiver, a transmitter, a transceiver, and/or any other component or circuit of a phased array antenna system.

In the example shown in FIG. 5, the VGA circuit 500 includes a first circuit segment 510A-510B and a second circuit segment 540A-540B. A first portion (e.g., 510A) of the first circuit segment 510A-510B includes a set of differential switches 512-516, and a second portion (e.g., 510B) of the first circuit segment 510A-510B includes another set of differential switches 518-522 and a resistor ladder 524 (or ladder 524), such as an R-2R resistor ladder for example. Similarly, a first portion (e.g., 540A) of the second circuit segment 540A-540B includes a set of differential switches 542-546, and a second portion (e.g., 540B) of the first circuit segment 540A-540B includes another set of differential switches 548-552 and a resistor ladder 554 (or ladder 554), such as an R-2R resistor ladder for example. The number of circuit segments included in the VGA circuit 500 shown in FIG. 5 is merely one illustrative example provided for explanation purposes. One of ordinary skill in the art will recognize from the disclosure herein that, in other examples, the VGA circuit 500 may include more or less circuit segments than shown in FIG. 5.

The first circuit segment 510A-510B and the second circuit segment 540A-540B can be coupled to a differential pair 530 that receives input signals 502 and 504 for the VGA circuit 500. The differential pair 530 can include transistors 532A and 532B. The input signals 502 and 504 can include differential signals. In some examples, the input signal 502 can correspond to a positive current and input signal 504 can correspond to a negative current. As shown in FIG. 5, transistor 532A of the differential pair 530 can receive the input signal 502 at a base of the transistor 532A, and transistor 532B of the differential pair 530 can receive the input signal 504 at a base of the transistor 532B. The transistors 532A and 532B can include, for example and without limitation, bipolar junction transistors (BJTs) and/or the like.

The differential switches 512-542 of the first circuit segment 510A-510B and the second circuit segment 540A-540B can be turned on or off to steer the input signals 502 and 504 through specific portions or stages of the ladders 524 and 554. For example, digital control inputs 580A-580N can be provided to the base of transistors in the differential switches 512-542 of the first circuit segment 510A-510B and the second circuit segment 540A-540B to turn the differential switches 512-542 on or off. To illustrate, a digital control input can be provided to the base of a first transistor of the differential switch 512 and a digital control input can be provided to the base of a second transistor of the differential switch 512. The digital control inputs provided to the first and second transistors of the differential switch 512 can turn one transistor on and the other transistor off, or can turn both transistors off or on.

In some examples, the first circuit segment 510A-510B and second circuit segment 540A-540B can create a variable gain amplifier. Moreover, the differential switches 512-542 of the first circuit segment 510A-510B and the second circuit segment 540A-540B can be turned on or off to move current from positive to negative outputs. For example, specific differential switches from the differential switches 512-542 of the first circuit segment 510A-510B and/or the second circuit segment 540A-540B can be turned on or off to control how much current goes to the positive and negative outputs, change the polarity and/or the amplitude on each side of the chain of circuit elements in the first circuit segment 510A-510B and second circuit segment 540A-540B, etc. In some cases, digital control inputs 580A-580N can be provided to positive and/or negative sides of any or all of the differential switches 512-542 to steer positive and negative currents in the VGA circuit 500 and cancel current between positive and negative to control the amplitude at the output.

Each of the ladders 524 and 554 can include a first set of resistor elements 555, such as nR resistor elements where n is a value that is greater than 1 (e.g., 2R resistors, etc.), and a second set of resistor elements 560, such as 1R resistor elements for example. In some examples, an nR resistor element can have a higher resistance value than a 1R resistor element. For example, in some cases, an nR resistor element can have twice the resistance value of a 1R resistor element.

In some cases, the first set of resistor elements 555 and the second set of resistor elements 560 can be interconnected (e.g., in series, parallel, series-parallel hybrid, etc.) between the output nodes 582 and a ground terminal 585. In some examples, in each of the ladders 524 and 554, a ladder leg or rung of resistor elements from the first set of resistor elements 555 can be connected to a first coupling point of portion of resistor elements from the second set of resistor elements 560 and a second coupling point of a different portion of resistor elements from the second set of resistor elements 560. For example, a first coupling point of a ladder leg of resistor elements from the first set of resistor elements 555 can be coupled to electrical line 590A and/or electrical line 590B, and a second coupling point of the ladder leg can be coupled to electrical line 592A and/or electrical line 592B. In this example, the electrical line 590A and/or 590B can interconnect a portion of the second set of resistor elements 560, and electrical line 592A and/or 592B can interconnect a different portion of the second set of resistor elements 560.

In some cases, the first set of resistor elements 555 can include 2R resistor elements and the first set of resistor elements 560 can include R or 1R resistor elements. In this example, on one end, a 2R leg of the ladder 524 can be connected to electrical line 590A, which can interconnect a portion of R resistor elements from the second set of resistor elements 560 and, on another end, the 2R leg of the ladder 524 can be connected to electrical line 592A, which can interconnect a different portion of R resistor elements from the second set of resistor elements 560. Similarly, in some cases, on one end, a 2R leg of the ladder 554 can be connected to electrical line 590B, which can interconnect a portion of R resistor elements from the second set of resistor elements 560 and, on another end, the 2R leg of the ladder 554 can be connected to electrical line 592B, which can interconnect a different portion of R resistor elements from the second set of resistor elements 560.

In some examples, the ladders 524 and 554 can divide the current associated with the input signals 502 and 504 into binary-weighted currents. Moreover, the differential switches 512-542 can steer the binary-weighted currents to output nodes 582. In some examples, the output nodes 582 can respectively output positive outputs 506A and 508A, and negative outputs 506B and 508B. The differential switches 512-542 can steer the binary-weighted currents to the output nodes 582 depending on the control inputs 580A-580N. In some cases, each rung or step on the ladders 524 and 554 can provide a binary-scaled value with a cumulative output taken at the end of the ladders 524 and 554.

The architecture with the ladders 524 and 554 shown in FIG. 5 (e.g., the architecture of VGA circuit 500 including the first circuit segment 510A-510B and the second circuit segment 540A-540B) can create smaller gain steps with a smaller number of transistors, smaller transistor sizes, and/or smaller transistor scaling factors (e.g., transistors having the smallest scaling factor that can be used such as a scaling factor of 1). For example, in some cases, the architecture with the ladders 524 and 554 can create binary steps, such as 6 decibel (dB) gain steps, while keeping the device size at the smallest device scaling factor that can be used (e.g., scaling factor of 1) as opposed to stepping the stepping the device size to 2, 4, 8, 16, etc., and/or any other increasing scaling factors. In some cases, the architecture with the ladders 524 and 554 can implement different binary weight scalings. In some examples, each binary step in the architecture with the ladders 524 and 554 can be a 6 dB gain step. In other examples, each binary step in the architecture with the ladders 524 and 554 can be more or less than 6 dB. Moreover, the architecture with the ladders 524 and 554 can implement different distributions between binary-weighted switches and/or R2R switches.

In some cases, the architecture with the ladders 524 and 554 shown in FIG. 5 can simplify any resistor-matching parameters or requirements since a smaller number of resistor values and/or a smaller scaling factor can be used. Moreover, the architecture with the ladders 524 and 554 shown in FIG. 5 can greatly reduce the load and parasitic capacitance at the output nodes 582. For example, rather than scaling the binary-weighted transistors in every differential switch (e.g., differential switches 512-542) by a factor of 2, which can create a large load and parasitic capacitance at the output nodes, the architecture with the ladders 524 and 554 can implement transistors in multiple differential switches (e.g., in differential switches 552, 550, 548, 522, 520, 518) according to a minimum size and/or scaling factor of 1, and limit any increases in the number and/or size of any additional transistors in the remaining differential switches (e.g., differential switches 546, 544, 542, 516, 514, 512) according to a scaling factor relative to the other transistors (e.g., the transistors according to the minimum size and/or scaling factor) that limits size increases to a maximum scaling factor.

To illustrate, assume that the differential switch 522 has a minimum number and/or size of transistors. Instead of increasing the size and/or number of transistors in each of the other differential switches in circuit segment 510A-510B (e.g., differential switches 524-512) by a factor of 2 such that the transistors at differential switches 520, 518, 516, 514, and 512 are respectively increased to 2, 4, 8, 16, and 32, the transistors at differential switches 522-516 can stay at a minimum size, number and/or scaling factor, and the transistors and/or transistor sizes at the other differential switches in circuit segment 510A-510B (e.g., differential switches 514-512) can be increased up to (e.g., without exceeding) a factor of 4 to sizes 2 and 4, respectively. As a result, the parasitic capacitance at the output nodes 582 can be greatly reduced. The reduced parasitic capacitance can reduce the total load capacitance. The lower parasitic capacitance and total load capacitance at output can allow (and/or facilitate) the VGA circuit 500 and/or the phased array system implementing the VGA circuit 500 to work at higher frequencies such as, for example and without limitation, 15 gigahertz (GHz) and/or higher.

In some examples, each of the differential switches 512-542 can include a respective set of transistors. The transistors can include, for example and without limitation, bipolar junction transistors (BJTs) and/or the like.

In some cases, a VGA circuit (e.g., VGA circuit 500) using a differential switch and ladder architecture as described above, can share an R-2R attenuator network between the differential inputs (e.g., between the positive and negative currents). FIGS. 6A and 6B illustrate examples of a VGA circuit 600 with an R-2R attenuator network shared between the differential inputs (e.g., between the positive and negative currents). With reference to FIG. 6A, VGA circuit 600 includes a ladder 634 of resistor elements that is shared between differential switches 610-620 on one side of the VGA circuit 600 and differential switches 622-632 on another side of the VGA circuit 600. The ladder 634 can include a first set of resistor elements 640-654, and a second set of resistor elements 656-666. In some examples, the first set of resistor elements 640-654 can include R2 resistors.

The VGA circuit 600 can also include a differential pair including transistors 606 and 608. The transistors 606 and 608 can include, for example and without limitation, bipolar junction transistors (BJTs) and/or the like. Transistor 606 can receive input signal 602A at a base of transistor 606, and transistor 608 can receive input signal 602B at a base of transistor 608. In some examples, the input signals 602A and 602B can include differential signals. The differential switches 610-620 and 622-632 can steer the current through specific resistor elements in the ladder 634 depending on the digital control inputs. For example, if differential switch 610 is turned on by a digital control input, a current can flow from transistor 606 through differential switch 610 to node 672. If differential switch 610 is turned off by the digital control input, the current can continue to differential switch 612 or the next differential switch that is turned on from the differential switches 612-620.

If the differential switch 610 is turned on, the current can then flow from node 672 through resistor 658 to node 676. The current can flow from node 676 to differential switch 612, which can similarly steer the current. The current can be steered until reaching output node 682, which can provide the output 604A of the VGA circuit 600.

Similarly, if differential switch 622 is turned on by a digital control input, a current can flow from transistor 608 through differential switch 622 to node 670. If differential switch 622 is turned off by the digital control input, the current can continue to differential switch 624 or the next differential switch that is turned on from the differential switch 624-632. If the differential switch 622 is turned on, the current can then flow from node 670 through resistor 656 to node 678. The current can flow from node 678 to differential switch 626, which can similarly steer the current. The current can be steered until reaching output node 684, which can provide the output 604B of the VGA circuit 600.

The resistor elements 640 and 642 can provide an impedance match between the positive and negative legs of the differential signal. In some cases, the impedance value between the positive and negative sides can be high, which can limit or prevent a flow of current through the resistor elements 640 and 642 and/or can allow current to be transferred or taken from the positive and/or negative sides.

In some cases, one or more capacitors and/or transistors in an off state can be included in the VGA circuit 600 to, among other things, compensate for parasitic capacitance, improve a gain and phase control, improve an accuracy of gain steps, and/or improve a phase shifting and beamforming accuracy. For example, with reference to FIG. 6B, the VGA circuit 600 can be modified to include capacitors 686-696 in the ladder 634. In some examples, the capacitors 686-696 can be in parallel with the resistors 656-666. The capacitors 686-696 can be used to compensate for transistor parasitic capacitances.

For example, the capacitors 686-696 can reduce the load and/or the parasitic capacitance at the output nodes 682-684. The lower load and capacitance at output can allow (and/or facilitate) the VGA circuit and the phased array system implementing the VGA circuit to work at higher frequencies (and/or to work better at higher frequencies) In some examples, the capacitors 686-696 can implement a "broadband" Z2Z-DAC, where Z is an impedance. At low frequencies, the R2R-DAC can dominate and provide binary weight current-steering to the outputs. At high frequency, the capacitors 686-696 can kick in and dominate the current dividing. In some examples, there will be parasitic capacitance to ground, and that capacitance can start to shunt current away from the R-2R ladder. Accordingly, the capacitors can be implemented for the current dividing.

In some examples, the VGA circuit 600 can be modified to include transistors in the off state in ladder 634. For example, in some cases, one or more of the capacitors 686-696 can be replaced with transistors in an off state. The transistors in the off state can compensate for parasitics in transistors, such as the transistors in the differential switches 610-632. In some cases, the transistors in the off state can also improve a performance across process corners. In some cases, the VGA circuit 600 can be modified to include transistors in the off state to put a same "type" of capacitor as series capacitors as the shunt parasitic capacitance is made of.

In some cases, multiple VGA circuits (e.g., VGA circuit 500, VGA circuit 600) can be combined to create a quadrature vector modulator (e.g., a phase shifter). For example, two of the VGA circuits described herein can be combined, with each receiving a different quadrature input, to create a quadrature vector modulator.

In some examples, one or more processes, such as digital signaling and/or data processing operations, may be performed by one or more computing devices or apparatuses. In some examples, the phased array antenna systems, VGA circuits, and/or other components described herein can be implemented by a user terminal or SAT shown in FIG. 1A and/or one or more computing devices with the computing device architecture 700 shown in FIG. 7. In some cases, such a computing device or apparatus may include a processor, microprocessor, microcomputer, or other component of a device that is configured to carry out one or more operations described herein. In some examples, such computing device or apparatus may include one or more antennas for sending and receiving RF signals. In some examples, such computing device or apparatus may include an antenna and a modem for sending, receiving, modulating, and demodulating RF signals, as previously described.

The components of the computing device can be implemented in circuitry. For example, the components can include and/or can be implemented using electronic circuits or other electronic hardware, which can include one or more programmable electronic circuits (e.g., microprocessors, graphics processing units (GPUs), digital signal processors (DSPs), central processing units (CPUs), and/or other suitable electronic circuits), and/or can include and/or be implemented using computer software, firmware, or any combination thereof, to perform the various operations described herein. The computing device may further include a display (as an example of the output device or in addition to the output device), a network interface configured to communicate and/or receive the data, any combination thereof, and/or other component(s). The network interface may be configured to communicate and/or receive Internet Protocol (IP) based data or other type of data.

In some cases, one or more operations described herein can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which any operations are described is not intended to be construed as a limitation, and any number of the described operations can be combined in any order and/or in parallel to implement the processes.

FIG. 7 illustrates an example computing device architecture 700 of an example computing device which can implement various techniques and/or operations described herein. For example, the computing device architecture 700 can be used to implement at least some portions of the SATs 102, the SAGs 104, the user terminals 112 and/or the user network devices 114 shown in FIG. 1A, and perform at least some of the operations described herein. The components of the computing device architecture 700 are shown in electrical communication with each other using a connection 705, such as a bus. The example computing device architecture 700 includes a processing unit (CPU or processor) 710 and a computing device connection 705 that couples various computing device components including the computing device memory 715, such as read only memory (ROM) 720 and random access memory (RAM) 725, to the processor 710.

The computing device architecture 700 can include a cache of high-speed memory connected directly with, in close proximity to, or integrated as part of the processor 710. The computing device architecture 700 can copy data from the memory 715 and/or the storage device 730 to the cache 712 for quick access by the processor 710. In this way, the cache can provide a performance boost that avoids processor 710 delays while waiting for data. These and other modules can control or be configured to control the processor 710 to perform various actions. Other computing device memory 715 may be available for use as well. The memory 715 can include multiple different types of memory with different performance characteristics. The processor 710 can include any general purpose processor and a hardware or software service stored in storage device 730 and configured to control the processor 710 as well as a special-purpose processor where software instructions are incorporated into the processor design. The processor 710 may be a self-contained system, containing multiple cores or processors, a bus, memory controller, cache, etc. A multi-core processor may be symmetric or asymmetric.

To enable user interaction with the computing device architecture 700, an input device 745 can represent any number of input mechanisms, such as a microphone for speech, a touch-sensitive screen for gesture or graphical input, keyboard, mouse, motion input, speech and so forth. An output device 735 can also be one or more of a number of output mechanisms known to those of skill in the art, such as a display, projector, television, speaker device. In some instances, multimodal computing devices can enable a user to provide multiple types of input to communicate with the computing device architecture 700. The communication interface 740 can generally govern and manage the user input and computing device output. There is no restriction on operating on any particular hardware arrangement and therefore the basic features here may easily be substituted for improved hardware or firmware arrangements as they are developed.

Storage device 730 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 725, read only memory (ROM) 720, and hybrids thereof. The storage device 730 can include software, code, firmware, etc., for controlling the processor 710. Other hardware or software modules are contemplated. The storage device 730 can be connected to the computing device connection 705. In one aspect, a hardware module that performs a particular function can include the software component stored in a computer-readable medium in connection with the necessary hardware components, such as the processor 710, connection 705, output device 735, and so forth, to carry out the function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Specific details are provided in the description above to provide a thorough understanding of the embodiments and examples provided herein. However, it will be understood by one of ordinary skill in the art that the embodiments may be practiced without these specific details. For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Individual embodiments may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using signals and/or computer-executable instructions that are stored or otherwise available from computer-readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

Devices implementing processes and methods according to these disclosures can include hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication devices, or integrated circuit devices having multiple uses including application in wireless communications and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Illustrative examples of the disclosure include:

Aspect 1: A variable gain amplifier comprising: a resistor ladder network comprising resistor legs coupled to a first plurality of resistors and a second plurality of resistors, wherein each resistor leg comprises one or more resistors; a first plurality of differential switches comprising a first set of differential switches connected to the resistor ladder network and a second set of differential switches connected to a set of output nodes, wherein a first transistor in each of the first set of differential switches is coupled to a first electrical line that interconnects the first plurality of resistors, and wherein a second transistor in each of the first set of differential switches is coupled to a second electrical line that interconnects the second plurality of resistors; a second plurality of differential switches comprising a third set of differential switches connected to the resistor ladder network and a fourth set of differential switches connected to the set of output nodes, wherein a third transistor in each of the third set of differential switches is coupled to the first electrical line, and wherein a fourth transistor in each of the fourth set of differential switches is coupled to the second electrical line; and a fifth transistor connected to the first set of differential switches and a sixth transistor connected to the third set of differential switches, wherein the fifth transistor is configured to receive a first input signal corresponding to a differential signal pair and the sixth transistor is configured to receive a second input signal corresponding to the differential signal pair.

Aspect 2: The variable gain amplifier of Aspect 1, wherein differential switches in the first plurality of differential switches and the second plurality of differential switches comprise digitally-controlled binary-weighted differential switches, and wherein each of the one or more resistors comprises a 1R or nR resistor.

Aspect 3: The variable gain amplifier of any of Aspects 1 to 2, wherein a number of transistors in each of the second set of differential switches and the fourth set of differential switches is scaled up to a maximum scale size relative to the first set of differential switches and the third set of differential switches, and wherein two or more of the first set of differential switches and the third set of differential switches comprise a same number of transistors.

Aspect 4: The variable gain amplifier of Aspect 3, wherein the maximum scale size is based on a factor of four, and wherein the same number of transistors associated with the two or more of the first set of differential switches and the third set of differential switches corresponds to a scaling factor of 1.

Aspect 5: The variable gain amplifier of any of Aspects 1 to 4, wherein the variable gain amplifier comprises a first circuit segment and a second circuit segment, wherein the first circuit segment comprises the first plurality of differential switches and a first portion of the resistor ladder network, and wherein the second circuit segment comprises the second plurality of differential switches and a second portion of the resistor ladder network.

Aspect 6: The variable gain amplifier of Aspect 5, wherein the fifth transistor is connected to the first circuit segment and the sixth transistor is connected to the second circuit segment.

Aspect 7: The variable gain amplifier of any of Aspects 1 to 6, further comprising a first set of capacitors in parallel to the first plurality of resistors and a second set of capacitors in parallel to the second plurality of resistors.

Aspect 8: The variable gain amplifier of any of Aspects 1 to 7, further comprising a first set of transistors in parallel to the first plurality of resistors and a second set of transistors in parallel to the second plurality of resistors, wherein the first set of transistors and the second set of transistors are configured in an off state.

Aspect 9: A system comprising: a plurality of antenna elements; one or more frontend circuits communicatively coupled with the plurality of antenna elements, wherein each frontend circuit is communicatively coupled with a respective set of antenna elements from the plurality of antenna elements; and a variable gain amplifier comprising: a resistor ladder network comprising resistor legs coupled to a first plurality of resistors and a second plurality of resistors, wherein each resistor leg comprises one or more resistors; a first plurality of differential switches comprising a first set of differential switches connected to the resistor ladder network and a second set of differential switches connected to a set of output nodes, wherein a first transistor in each of the first set of differential switches is coupled to a first electrical line that interconnects the first plurality of resistors, and wherein a second transistor in each of the first set of differential switches is coupled to a second electrical line that interconnects the second plurality of resistors; a second plurality of differential switches comprising a third set of differential switches connected to the resistor ladder network and a fourth set of differential switches connected to the set of output nodes, wherein a third transistor in each of the third set of differential switches is coupled to the first electrical line, and wherein a fourth transistor in each of the fourth set of differential switches is coupled to the second electrical line; and a fifth transistor connected to the first set of differential switches and a sixth transistor connected to the third set of differential switches, wherein the fifth transistor is configured to receive a first input signal corresponding to a differential signal pair and the sixth transistor is configured to receive a second input signal corresponding to the differential signal pair.

Aspect 10: The system of Aspect 9, further comprising a plurality of beamformers connected to the one or more frontend circuits, wherein at least one of the one or more frontend circuits and the plurality of beamformers includes the variable gain amplifier.

Aspect 11: The system of any of Aspects 9 to 10, wherein differential switches in the first plurality of differential switches and the second plurality of differential switches comprise digitally-controlled binary-weighted differential switches, and wherein each of the one or more resistors comprises a 1R or nR resistor.

Aspect 12: The system of any of Aspects 9 to 11, wherein a number of transistors in each of the second set of differential switches and the fourth set of differential switches is scaled up to a maximum scale size relative to the first set of differential switches and the third set of differential switches, and wherein two or more of the first set of differential switches and the third set of differential switches comprise a same number of transistors.

Aspect 13: The system of Aspect 12, wherein the maximum scale size is based on a factor of four, and wherein the same number of transistors associated with the two or more of the first set of differential switches and the third set of differential switches corresponds to a scaling factor of 1.

Aspect 14: The system of any of Aspects 9 to 13, wherein the variable gain amplifier comprises a first circuit segment and a second circuit segment, wherein the first circuit segment comprises the first plurality of differential switches and a first portion of the resistor ladder network, and wherein the second circuit segment comprises the second plurality of differential switches and a second portion of the resistor ladder network.

Aspect 15: The system of Aspect 14, wherein the fifth transistor is connected to the first circuit segment and the sixth transistor is connected to the second circuit segment.

Aspect 16: The system of any of Aspects 9 to 15, further comprising a first set of capacitors in parallel to the first plurality of resistors and a second set of capacitors in parallel to the second plurality of resistors.

Aspect 17: The system of any of Aspects 9 to 16, further comprising a first set of transistors in parallel to the first plurality of resistors and a second set of transistors in parallel to the second plurality of resistors, wherein the first set of transistors and the second set of transistors are configured in an off state.

Aspect 18: The system of any of Aspects 9 to 17, further comprising an antenna assembly and one or more printed circuit boards.

Aspect 19: A variable gain amplifier comprising: a first resistor ladder comprising resistor legs coupled to first resistors and second resistors, wherein each resistor leg comprises one or more resistors; a second resistor ladder comprising additional resistor legs coupled to third resistors and fourth resistors, wherein each resistor leg comprises one or more additional resistors; a first circuit segment comprising: a first plurality of differential switches comprising first differential switches connected to the first resistor ladder and second differential switches connected to a first output nodes, wherein a transistor in each of the first differential switches is coupled to a first electrical line that interconnects the first resistors, and wherein a different transistor in each of the first differential switches is coupled to a second electrical line that interconnects the second resistors; and a second plurality of differential switches comprising third differential switches connected to the first resistor ladder and fourth differential switches connected to the first output nodes, wherein a transistor in each of the third differential switches is coupled to the first electrical line and a different transistor in each of the fourth differential switches is coupled to the second electrical line; a second circuit segment comprising: a third plurality of differential switches comprising fifth differential switches connected to the second resistor ladder and sixth differential switches connected to second output nodes, wherein a transistor in each of the fifth differential switches is coupled to a third electrical line that interconnects the third resistors and a different transistor in each of the sixth differential switches is coupled to a fourth electrical line that interconnects the fourth resistors; and a fourth plurality of differential switches comprising seventh differential switches connected to the second resistor ladder and eighth differential switches connected to the second output nodes, wherein a transistor in each of the seventh differential switches is coupled to the third electrical line and a different transistor in each of the eighth differential switches is coupled to the fourth electrical line; and an additional transistor connected to the first circuit segment and a different additional transistor connected to the second circuit segment.

Aspect 20: The variable gain amplifier of Aspect 19, wherein the additional transistor is configured to receive a first input signal corresponding to a differential signal pair and the different additional transistor is configured to receive a second input signal corresponding to the differential signal pair.

Aspect 21: The variable gain amplifier of any of Aspects 19 to 20, wherein differential switches in the first circuit segment and the second circuit segment comprise digitally-controlled binary-weighted differential switches, and wherein each of the one or more resistors and the one or more additional resistors comprises a 1R or nR resistor.

Aspect 22: The variable gain amplifier of any of Aspects 19 to 21, wherein a number of transistors in each of the second differential switches and the fourth differential switches is scaled up to a maximum scaling size relative to the first differential switches and the third differential switches, wherein two or more of the first differential switches and the third differential switches comprise a same number of transistors, and wherein the maximum scaling size is based on a scaling factor.

Aspect 23: A non-transitory computer-readable medium having stored thereon instructions that, when executed by one or more processing devices, cause the one or more processing devices to generate one or more digital control signals for controlling a circuit, the circuit comprising a variable gain amplifier according to any of Aspects 1 to 9.

Aspect 24: A method comprising: determining, via one or more processing devices, one or more digital control signals for controlling for a circuit, the circuit comprising a variable gain amplifier according to any Aspects 1 to 9; and providing, via the one or more processing devices, the one or more digital control signals to the circuit.

What is claimed is:
1. A variable gain amplifier comprising:
a resistor ladder network comprising resistor legs coupled to a first plurality of resistors and a second plurality of resistors, wherein each resistor leg comprises one or more resistors;
a first plurality of differential switches comprising a first set of differential switches connected to the resistor ladder network and a second set of differential switches connected to a set of output nodes, wherein a first transistor in each of the first set of differential switches is coupled to a first electrical line that interconnects the first plurality of resistors, and wherein a second transistor in each of the first set of differential switches is coupled to a second electrical line that interconnects the second plurality of resistors;
a second plurality of differential switches comprising a third set of differential switches connected to the resistor ladder network and a fourth set of differential switches connected to the set of output nodes, wherein a third transistor in each of the third set of differential switches is coupled to the first electrical line, and wherein a fourth transistor in each of the fourth set of differential switches is coupled to the second electrical line; and
a fifth transistor connected to the first set of differential switches and a sixth transistor connected to the third set of differential switches, wherein the fifth transistor is configured to receive a first input signal corresponding to a differential signal pair and the sixth transistor is configured to receive a second input signal corresponding to the differential signal pair.

2. The variable gain amplifier of claim 1, wherein differential switches in the first plurality of differential switches and the second plurality of differential switches comprise digitally-controlled binary-weighted differential switches, and wherein each of the one or more resistors comprises a 1R resistor or an nR resistor.

3. The variable gain amplifier of claim 1, wherein a number of transistors in each of the second set of differential switches and the fourth set of differential switches is scaled up to a maximum scale size relative to the first set of differential switches and the third set of differential switches, and wherein two or more of the first set of differential switches and the third set of differential switches comprise a same number of transistors.

4. The variable gain amplifier of claim 3, wherein the maximum scale size is based on a factor of four, and wherein the same number of transistors associated with the two or more of the first set of differential switches and the third set of differential switches corresponds to a scaling factor of 1.

5. The variable gain amplifier of claim 1, wherein the variable gain amplifier comprises a first circuit segment and a second circuit segment, wherein the first circuit segment comprises the first plurality of differential switches and a first portion of the resistor ladder network, and wherein the second circuit segment comprises the second plurality of differential switches and a second portion of the resistor ladder network.

6. The variable gain amplifier of claim 5, wherein the fifth transistor is connected to the first circuit segment and the sixth transistor is connected to the second circuit segment.

7. The variable gain amplifier of claim 1, further comprising a first set of capacitors in parallel to the first plurality of resistors and a second set of capacitors in parallel to the second plurality of resistors.

8. The variable gain amplifier of claim 1, further comprising a first set of transistors in parallel to the first plurality of resistors and a second set of transistors in parallel to the second plurality of resistors, wherein the first set of transistors and the second set of transistors are configured in an off state.

9. A system comprising:
one or more frontend circuits communicatively coupled with a plurality of antenna elements, wherein each frontend circuit is communicatively coupled with a respective set of antenna elements from the plurality of antenna elements; and
a variable gain amplifier comprising:
a resistor ladder network comprising resistor legs coupled to a first plurality of resistors and a second plurality of resistors, wherein each resistor leg comprises one or more resistors;
a first plurality of differential switches comprising a first set of differential switches connected to the resistor ladder network and a second set of differential switches connected to a set of output nodes, wherein a first transistor in each of the first set of differential switches is coupled to a first electrical line that interconnects the first plurality of resistors, and wherein a second transistor in each of the first set of differential switches is coupled to a second electrical line that interconnects the second plurality of resistors;
a second plurality of differential switches comprising a third set of differential switches connected to the resistor ladder network and a fourth set of differential switches connected to the set of output nodes, wherein a third transistor in each of the third set of differential switches is coupled to the first electrical line, and wherein a fourth transistor in each of the fourth set of differential switches is coupled to the second electrical line; and
a fifth transistor connected to the first set of differential switches and a sixth transistor connected to the third set of differential switches, wherein the fifth transistor is configured to receive a first input signal corresponding to a differential signal pair and the sixth transistor is configured to receive a second input signal corresponding to the differential signal pair.

10. The system of claim 9, further comprising a plurality of beamformers connected to the one or more frontend circuits, wherein at least one of the one or more frontend circuits and the plurality of beamformers includes the variable gain amplifier.

11. The system of claim 9, wherein differential switches in the first plurality of differential switches and the second plurality of differential switches comprise digitally-controlled binary-weighted differential switches, and wherein each of the one or more resistors comprises a 1R or 2R resistor.

12. The system of claim 9, wherein a number of transistors in each of the second set of differential switches and the fourth set of differential switches is scaled up to a maximum scale size relative to the first set of differential switches and the third set of differential switches, and wherein two or more of the first set of differential switches and the third set of differential switches comprise a same number of transistors.

13. The system of claim 12, wherein the maximum scale size is based on a factor of four, and wherein the same number of transistors associated with the two or more of the first set of differential switches and the third set of differential switches corresponds to a scaling factor of 1.

14. The system of claim 9, wherein the variable gain amplifier comprises a first circuit segment and a second circuit segment, wherein the first circuit segment comprises the first plurality of differential switches and a first portion of the resistor ladder network, and wherein the second circuit segment comprises the second plurality of differential switches and a second portion of the resistor ladder network.

15. The system of claim 14, wherein the fifth transistor is connected to the first circuit segment and the sixth transistor is connected to the second circuit segment.

16. The system of claim 9, further comprising a first set of capacitors in parallel to the first plurality of resistors and a second set of capacitors in parallel to the second plurality of resistors.

17. The system of claim 9, further comprising a first set of transistors in parallel to the first plurality of resistors and a second set of transistors in parallel to the second plurality of resistors, wherein the first set of transistors and the second set of transistors are configured in an off state.

18. The system of claim 9, further comprising an antenna assembly and one or more printed circuit boards.

19. A variable gain amplifier comprising:
a first resistor ladder comprising resistor legs coupled to first resistors and second resistors, wherein each resistor leg comprises one or more resistors;
a second resistor ladder comprising additional resistor legs coupled to third resistors and fourth resistors, wherein each resistor leg comprises one or more additional resistors;
a first circuit segment comprising:

a first plurality of differential switches comprising first differential switches connected to the first resistor ladder and second differential switches connected to a first output nodes, wherein a transistor in each of the first differential switches is coupled to a first electrical line that interconnects the first resistors, and wherein a different transistor in each of the first differential switches is coupled to a second electrical line that interconnects the second resistors; and a second plurality of differential switches comprising third differential switches connected to the first resistor ladder and fourth differential switches connected to the first output nodes, wherein a transistor in each of the third differential switches is coupled to the first electrical line and a different transistor in each of the fourth differential switches is coupled to the second electrical line; and a second circuit segment comprising:

a third plurality of differential switches comprising fifth differential switches connected to the second resistor ladder and sixth differential switches connected to second output nodes, wherein a transistor in each of the fifth differential switches is coupled to a third electrical line that interconnects the third resistors and a different transistor in each of the sixth differential switches is coupled to a fourth electrical line that interconnects the fourth resistors; and a fourth plurality of differential switches comprising seventh differential switches connected to the second resistor ladder and eighth differential switches connected to the second output nodes, wherein a transistor in each of the seventh differential switches is coupled to the third electrical line and a different transistor in each of the eighth differential switches is coupled to the fourth electrical line.

20. The variable gain amplifier of claim 19, further comprising an additional transistor connected to the first circuit segment and a different additional transistor connected to the second circuit segment, wherein the additional transistor is configured to receive a first input signal corresponding to a differential signal pair and the different additional transistor is configured to receive a second input signal corresponding to the differential signal pair.

* * * * *